United States Patent [19]
Allen et al.

[11] Patent Number: 5,583,500
[45] Date of Patent: Dec. 10, 1996

[54] METHOD AND APPARATUS FOR PARALLEL ENCODING AND DECODING OF DATA

[75] Inventors: James D. Allen, Mountain View; Martin Boliek, Palo Alto; Michael Gormish, Los Altos; Edward L. Schwartz, Sunnyvale, all of Calif.

[73] Assignees: Ricoh Corporation, Menlo Park, Calif.; Ricoh Company, Ltd., Japan

[ * ] Notice: The term of this patent shall not extend beyond the expiration date of Pat. No. 5,381,145.

[21] Appl. No.: 172,646

[22] Filed: Dec. 23, 1993

Related U.S. Application Data

[63] Continuation-in-part of Ser. No. 16,035, Feb. 10, 1993, Pat. No. 5,381,145.

[51] Int. Cl.$^6$ .................................................. H03M 7/30
[52] U.S. Cl. ............................................. 341/107; 341/51
[58] Field of Search ................................. 341/51, 60, 63, 341/65, 67, 107

[56] References Cited

U.S. PATENT DOCUMENTS

| | | |
|---|---|---|
| 4,325,085 | 4/1982 | Gooch . |
| 4,494,108 | 1/1985 | Langdon, Jr. et al. ................ 341/51 |
| 4,929,946 | 5/1990 | O'Brien et al. . |
| 4,973,961 | 11/1990 | Chamzas et al. . |
| 5,097,261 | 3/1992 | Langdon, Jr. et al. . |
| 5,138,315 | 8/1992 | Le Queau et al. . |
| 5,225,832 | 7/1993 | Wang et al. . |
| 5,272,478 | 12/1993 | Allen . |
| 5,276,525 | 1/1994 | Gharavi . |
| 5,313,203 | 5/1994 | Suu ........................................ 341/50 |
| 5,319,457 | 6/1994 | Nakahashi et al. . |
| 5,357,250 | 10/1994 | Healy et al. ............................ 341/107 |

FOREIGN PATENT DOCUMENTS

| | | |
|---|---|---|
| 2269289 | 7/1992 | United Kingdom . |
| 2269070 | 4/1993 | United Kingdom . |

OTHER PUBLICATIONS

Lin, et al., "Designing a High–Throughput VLC Decoder; Part II—Parallel Decoding Methods", *IEEE, Transactions on Circuits and Systems for Video Technology*, vol. 2, No. 2, Jun., 1992.

"Optimum Run Length Codes", H. Meyr, Hans G. Rosdolsky, Thomas S. Huang, IEEE Transactions on Communications, vol. COM–22, No. 6, Jun. 1974, pp. 826–835.

"An Adaptive Run–Length Coding Algorithm", G. G. Langdon, Jr. IBM Technical Disclosure Bulletin, vol. 26, No. 7B, Dec. 1983, pp. 3783–3785.

"Adaptation of Ordering Techniques for Facsimile Pictures with No Single Element Runs", A. N. Netravali, F. W. Mounts, K. A. Walsh, The Bell System Technical Journal, vol. 58, No. 4, Apr. 1979, pp. 857–865.

"A Highly Efficient Run–Length Coding Scheme for Facsimile Transmission", Mikio Takagi, Toshitaka Tsuda, Electronics and Communications in Japan, vol. 58–A, No. 2, 1975, pp. 30–38.

"A Simple General Binary Source Code", Glen G. Langdon, Jr., Jorma Rissanen, IEEE Transactions on Information Theory, vol. IT–28, No. 5, Sep. 1982, pp. 800–803.

"A VLSI Chip Set for High–Speed Lossless Data Compression", Jack Venbrux, Pen–Shu Yeh, IEEE Transactions on Circuits and Systems for Video Technology, vol. 2, No. 4, Dec. 1992, pp. 381–391.

"Efficient Coding for Binary Information Sources", Ryoichi Ohnishi, Yutaka Ueno, Fumitaka Ono, Japan, Mar. 3, 1977, pp. 1–20.

*Primary Examiner*—Howard L. Williams
*Attorney, Agent, or Firm*—Blakely, Sokoloff, Taylor & Zafman

[57] ABSTRACT

The present invention provides a method and apparatus for encoding and decoding data in parallel. The present invention provides a system for decompressing a data stream having multiple codewords. The system includes an input channel that receives the data stream. The system also includes a decoder which decodes each bit of the data stream, wherein at least two of the codewords in the data stream are decoded at the same time, such that the data stream is decoded in parallel.

70 Claims, 28 Drawing Sheets

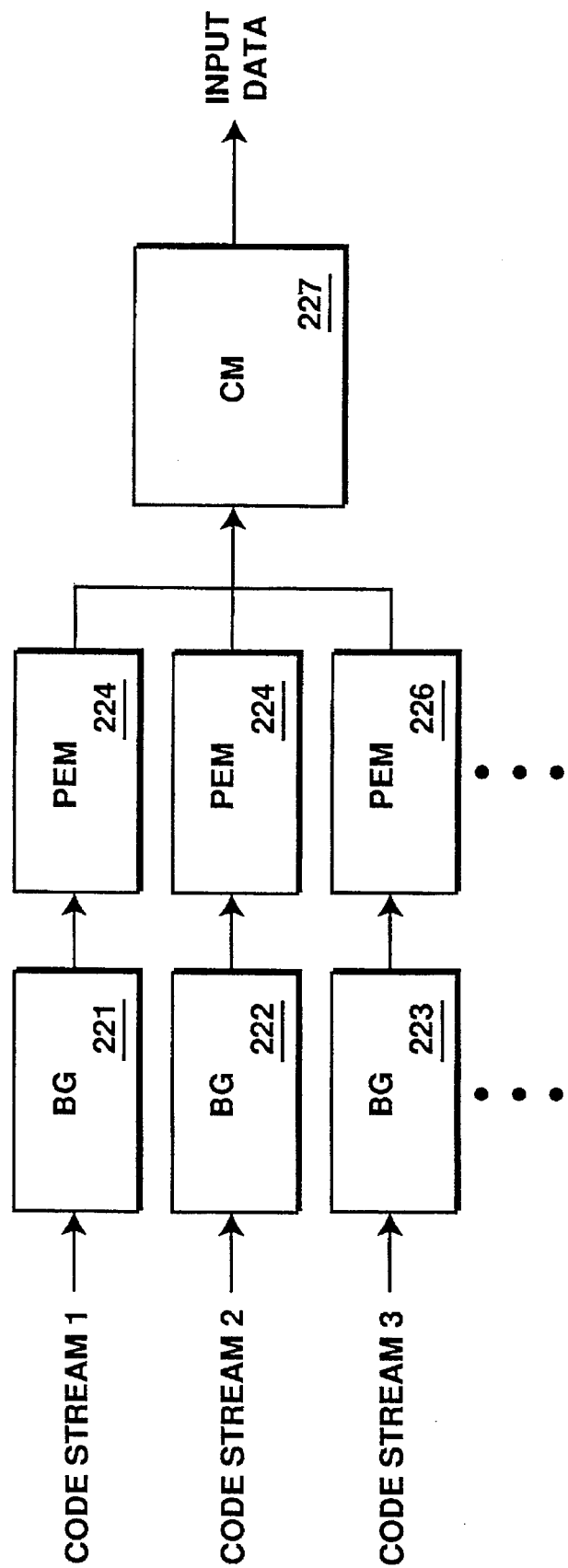

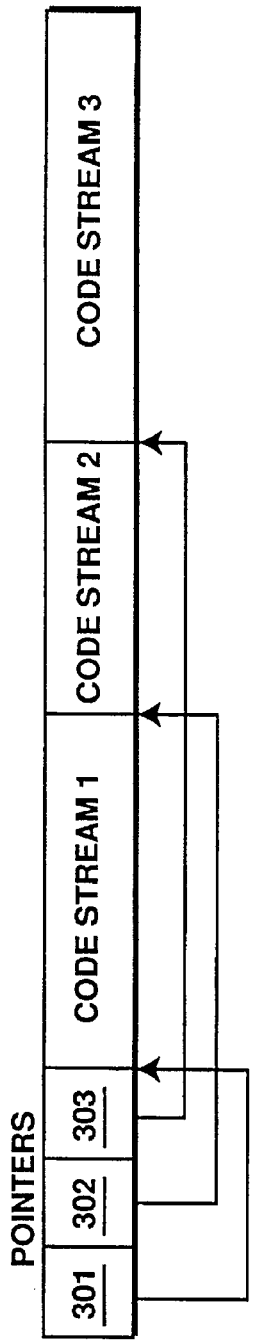
FIGURE 3
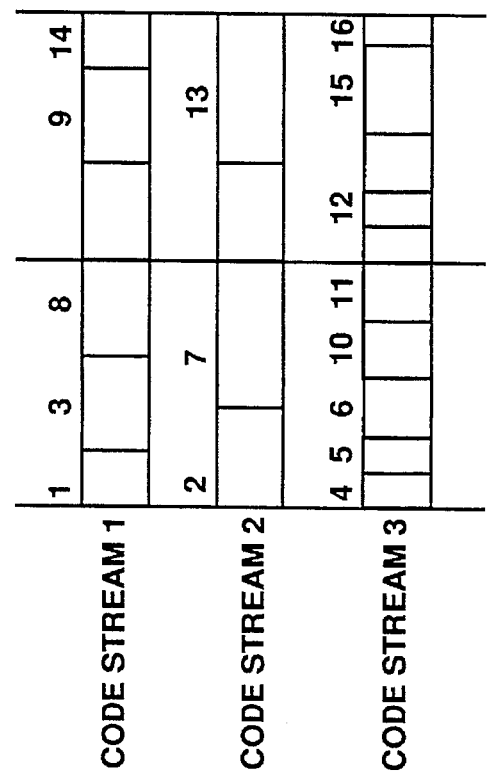
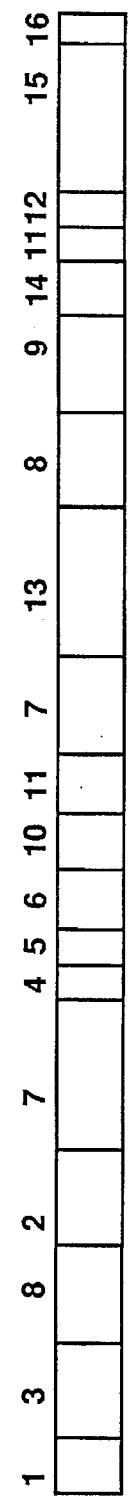
FIGURE 4

| STATE | CODE | STATE | CODE | STATE | CODE |
|---|---|---|---|---|---|
| −35 | R2(12) | −11 | R2(1) | 12 | R3(1) |
| −34 | R3(11) | −10 | R2(1) | 13 | R2(1) |
| −33 | R2(11) | −9 | R2(1) | 14 | R3(1) |
| −32 | R3(10) | −8 | R2(1) | 15 | R2(2) |
| −31 | R2(10) | −7 | R2(1) | 16 | R3(2) |
| −30 | R3(9) | −6 | R2(1) | 17 | R2(3) |
| −29 | R2(9) | −5 | R2(0) | 18 | R3(3) |
| −28 | R3(8) | −4 | R2(0) | 19 | R2(4) |
| −27 | R2(8) | −3 | R2(0) | 20 | R3(4) |
| −26 | R3(7) | −2 | R2(0) | 21 | R2(5) |
| −25 | R2(7) | −1 | R2(0) | 22 | R3(5) |
| −24 | R3(6) | −0 | R2(0) | 23 | R2(6) |
| −23 | R2(6) | 0 | R2(0) | 24 | R3(6) |
| −22 | R3(5) | 1 | R2(0) | 25 | R2(7) |
| −21 | R2(5) | 2 | R2(0) | 26 | R3(7) |
| −20 | R3(4) | 3 | R2(0) | 27 | R2(8) |
| −19 | R2(4) | 4 | R2(0) | 28 | R3(8) |
| −18 | R3(3) | 5 | R2(0) | 29 | R2(9) |
| −17 | R2(3) | 6 | R2(1) | 30 | R3(9) |
| −16 | R3(2) | 7 | R2(1) | 31 | R2(10) |
| −15 | R2(2) | 8 | R2(1) | 32 | R3(10) |
| −14 | R3(1) | 9 | R2(1) | 33 | R2(11) |
| −13 | R3(1) | 10 | R2(1) | 34 | R3(11) |
| −12 | R3(1) | 11 | R2(1) | 35 | R2(12) |

FIGURE 5

| OPERATION | BIT BEING PROCESSED (ONE CLOCK PER BIT) | | | | | | | | | | | |
|---|---|---|---|---|---|---|---|---|---|---|---|---|
| CM: DETERMINE CONTEXT BIN | 0 | 1 | 2 | 3 | 4 | 5 | 6 | 7 | 8 | 9 | 10 | 11 |
| MEMORY A: READ | | 0 | | 2 | | 4 | | 6 | | 8 | | 10 |
| MEMORY B: READ | | | 1 | | 3 | | 5 | | 7 | | 9 | |
| BG (1 OF 4): GENERATE BIT | | | 0 | | | | 4 | | | | 8 | |
| BG (2 OF 4): GENERATE BIT | | | | 1 | | | | 5 | | | | 9 |
| BG (3 OF 4): GENERATE BIT | | | | | 2 | | | | 6 | | | |
| BG (4 OF 4): GENERATE BIT | | | | | | 3 | | | | 7 | | |
| PEM: CONVERT STATE TO CODE | | | 0 | 1 | 2 | 3 | 4 | 5 | 6 | 7 | 8 | 9 |
| PEM: PEM STATE UPDATE | | | | 0 | 1 | 2 | 3 | 4 | 5 | 6 | 7 | 8 |
| PEM: PEM CONVERT NEW STATE TO CODE | | | | 0 | 1 | 2 | 3 | 4 | 5 | 6 | 7 | 8 |
| BG (1 OF 4): DECODE CODEWORD IF COUNT RUN | | | | 0 | | | | 4 | | | | 8 |
| BG (2 OF 4): DECODE CODEWORD IF COUNT RUN | | | | | 1 | | | | 5 | | | |
| BG (3 OF 4): DECODE CODEWORD IF COUNT RUN | | | | | | 2 | | | | 6 | | |
| BG (4 OF 4): DECODE CODEWORD IF COUNT RUN | | | | | | | 3 | | | | 7 | |
| MEMORY A: WRITE | | | | | 0 | | 2 | | 4 | | 6 | |
| MEMORY B: WRITE | | | | | | 1 | | 3 | | 5 | | 7 |
| BG (1 OF 4): BARREL SHIFT | | | | | 0 | | | | 4 | | | |
| BG (2 OF 4): BARREL SHIFT | | | | | | 1 | | | | 5 | | |
| BG (3 OF 4): BARREL SHIFT | | | | | | | 2 | | | | 6 | |
| BG (4 OF 4): BARREL SHIFT | | | | | | | | 3 | | | | 7 |

FIGURE 17

METHOD AND APPARATUS FOR PARALLEL ENCODING AND DECODING OF DATA

This application is a continuation-in-part application of U.S. patent application Ser. No. 08/016,035 entitled "Method And Apparatus For Parallel Decoding and Encoding of Data", filed Feb. 10, 1993, now U.S. Pat. No. 5,381,145.

FIELD OF THE INVENTION

The present invention relates to the field of data compression and decompression systems; particularly, the present invention relates to a method and apparatus for parallel encoding and decoding of data in compression/decompression systems.

BACKGROUND OF THE INVENTION

Today, data compression is widely used, particularly for storing and transmitting large amounts of data. Many different data compression techniques exist in the prior art. Compression techniques can be divided into two broad categories, lossy coding and lossless coding. Lossy coding involves coding that results in the loss of information, such that there is no guarantee of perfect reconstruction of the original data. In lossless compression, all the information is retained and the data is compressed in a manner which allows for perfect reconstruction.

In lossless compression, input symbols are converted to output codewords. If the compression is successful, the codewords are represented in fewer bits than the number of input symbols. Lossless coding methods include dictionary methods of coding (e.g., Lempel-Ziv), run length encoding, enumerative coding and entropy coding.

Entropy coding consists of any method of lossless coding which attempts to compress data close to the entropy limit using known or estimated symbol probabilities. Entropy codes include Huffman codes, arithmetic codes and binary entropy codes. Binary entropy coders are lossless coders which act only on binary (yes/no) decisions, often expressed as the most probable symbol (MPS) and the least probable symbol (LPS). Examples of binary entropy coders include IBM's Q-coder and a coder referred to as the B-coder. For more information on the B-coder, see U.S. Pat. No. 5,272, 478, entitled "Method and Apparatus for Entropy Coding", (J. D. Allen), issued Dec. 21, 1993, and assigned to the corporate assignee of the present invention. See also M. J. Gormish and J. D. Allen, "Finite State Machine Binary Entropy Coding," abstract in *Proc. Data Compression Conference*, 30 Mar. 1993, Snowbird, Utah, pg. 449. The B-coder is a binary entropy coder which uses a finite state machine for compression.

FIG. 1 shows a block diagram of a prior art compression and decompression system using a binary entropy coder. For coding, data is input into context model (CM) 101. CM 101 translates the input data into a set or sequence of binary decisions and provides the context bin for each decision. Both the sequence of binary decisions and their associated context bins are output from CM 101 to the probability estimation module (PEM) 102. PEM 102 receives each context bin and generates a probability estimate for each binary decision. The actual probability estimate is typically represented by a class, referred to as PClass. Each PClass is used for a range of probabilities. PEM 102 also determines whether the binary decision (result) is or is not in its more probable state (i.e., whether the decision corresponds to the MPS). The bit-stream generator (BG) module 103 receives the probability estimate (i.e., the PClass) and the determination of whether or not the binary decision was likely as inputs. In response, BG module 103 produces a compressed data stream, outputting zero or more bits, to represent the original input data.

For decoding, CM 104 provides a context bin to PEM 105, and PEM 105 provides the probability class (PClass) to BG module 106 based on the context bin. BG module 106 is coupled to receive the probability class. In response to the probability class and the compressed data, BG module 106 returns a bit representing whether the binary decision (i.e., the event) is in its most probable state. PEM 105 receives the bit, updates the probability estimate based on the received bit, and returns the result to CM 104. CM 104 receives the returned bit and uses the returned bit to generate the original data and update the context bin for the next binary decision.

One problem with decoders using binary entropy codes, such as IBM's Q-coder and the B-coder, is that they are slow, even when implemented in hardware. Their operation requires a single large, slow feedback loop. To restate the decoding process, the context model uses past decoded data to produce a context. The probability estimation module uses the context to produce a probability class. The bit-stream generator uses the probability class and the compressed data to determine if the next bit is the likely or unlikely result. The probability estimation module uses the likely/unlikely result to produce a result bit (and to update the probability estimate for the context). The result bit is used by the context model to update its history of past data. All of these steps are required for decoding a single bit. Because the context model must wait for the result bit to update its history before it can provide the next context, the decoding of the next bit must wait. It is desirable to avoid having to wait for the feedback loop to be completed before decoding the next bit. In other words, it is desirable to decode more than one bit or codeword at a time in order to increase the speed at which compressed data is decoded.

Another problem with decoders using binary entropy codes is that variable length data must be processed. In most systems, the codewords to be decoded have variable lengths. Alternatively, other systems encode variable length symbols (uncoded data). When processing the variable length data, it is necessary to shift the data at the bit level in order to provide the correct next data for the decoding or encoding operation. These bit level manipulations on the data stream can require costly and/or slow hardware and software. Furthermore, prior art systems require this shifting to be done in time critical feedback loops that limit the performance of the decoder. It would be advantageous to able to allow the bit level manipulation of the data stream to be performed either at the encoder or the decoder for applications where only one of the two operations is cost and/or speed critical. It would also be advantageous to remove the bit level manipulation of the data stream from time critical feedback loops, so that parallelization could be used to increase speed.

The present invention provides a lossless compression and decompression system. The present invention also provides a simple decoder which provides fast decoding. The present invention also provides a decoding system which decodes data in parallel and in a pipelined manner. The present invention also provides for decoding a binary entropy coded data stream without having to perform the bit level manipulations of the prior art in the critical feedback loops. The present invention also provides interleaving data for use by multiple coders (lossless or lossy) without using overhead for markers.

SUMMARY OF THE INVENTION

A method and apparatus for decompressing and compressing data is described. The present invention includes a method and apparatus for decoding a data stream having multiple codewords in a pipelined manner. The present invention includes a method and apparatus for assigning portions of the data stream to multiple decoding resources. The decoding resources then decode the data, wherein at least one of the decoding resources decodes its corresponding portion of the data stream during successive cycles in a pipelined manner.

In another embodiment, the decoding of the data stream begins with a determination of the current context bin. The decoder state for the current context bin is fetched from memory. This allows the probability estimate machine (PEM) state to be determined. A codeword is then processed and decoded. In the present invention, the determination of the context, determination of the PEM state and the processing of the codeword occurs in successive cycles in a pipelined manner.

The present invention also provides a method and apparatus for parallel decoding and encoding using variable length data. Data for decoding may be received from lossy or lossless coders. Similarly, the data received by be coded or uncoded.

BRIEF DESCRIPTION OF THE DRAWINGS

The present invention will be understood more fully from the detailed description given below and from the accompanying drawings of the preferred embodiments of the invention which, however, should not be taken to limit the invention to the specific embodiments, but are for explanation and understanding only.

FIG. 2C is a block diagram of one embodiment of the decoding system of the present invention which processes context bins in parallel.

FIG. 3 illustrates the non-interleaved code stream of the present invention.

FIG. 4 illustrates one embodiment of the interleaved code stream as derived from an exemplary set of data.

FIG. 5 is one example of a probability estimation table and bit-stream generator for the R-coder of the present invention.

FIG. 17 is a timing diagram depicting the pipelined decoding of the present invention.

DETAILED DESCRIPTION OF THE INVENTION

A method and apparatus for parallel encoding and decoding of data is described. In the following description, numerous specific details are set forth, such as specific numbers of bits, numbers of coders, specific probabilities, types of data, etc., in order to provide a thorough understanding of the preferred embodiments of the present invention. It will be understood to one skilled in the art that the present invention may be practiced without these specific details. Also, well-known circuits have been shown in block diagram form rather than in detail in order to avoid unnecessarily obscuring the present invention.

Parallel Entropy Coding

The present invention provides a system that decodes losslessly encoded data in parallel. The data is decoded in parallel by using multiple decoding resources. Each of the multiple decoding resources is assigned a portion of the data stream to decode. The assignment of the data stream occurs on the fly wherein the decoding resources decode data concurrently, thereby decoding the data stream in parallel. In order to enable the assignment of data in a manner which makes efficient use of the decoding resources, the data stream is ordered. This is referred to as parallelizing the data stream. The ordering of data allows each decoding resource to decode any or all of the coded data without waiting for feedback from the context model.

Figure 2A:
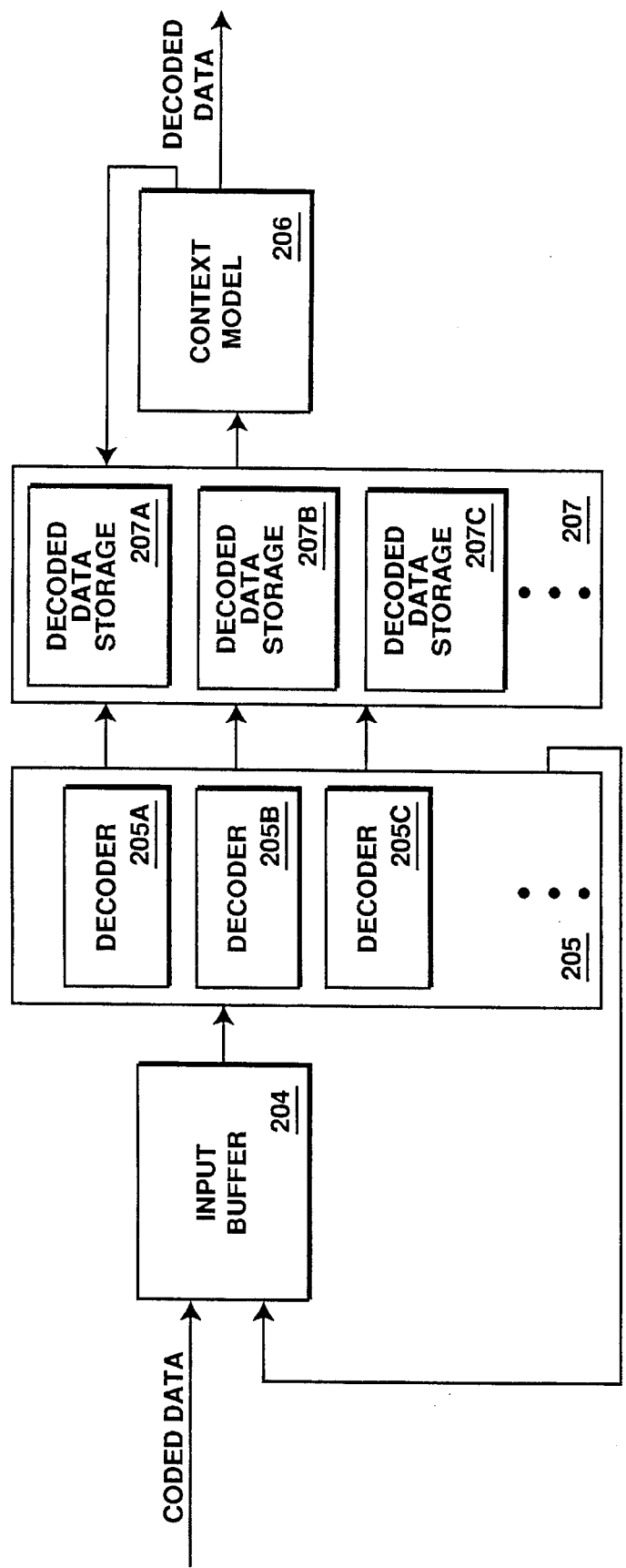
FIG. 2A is a block diagram of the decoding system of the present invention.

FIG. 2A illustrates the decoding system of the present invention without the slow feedback loop of the prior art. An input buffer 204 receives coded data (i.e., codewords) and a feedback signal from decoder 205 and supplies coded data in a predetermined order (e.g., context bin order) to decoder 205 of the present invention, which decodes the coded data. Decoder 205 includes multiple decoders (e.g., 205A, 205B, 205C, etc.).

In one embodiment, each of the decoders 205A–205C is supplied data for a group of contexts. Each of the decoders in decoder 205 is supplied coded data for every context bin in its group of contexts from input buffer 204. Using this data, each decoder 205A, 205B, 205C, etc. produces the decoded data for its group of context bins. The context model is not required to associate coded data with a particular group of context bins.

The decoded data is sent by decoder 205 to decoded data storage 207 (e.g., 207A, 207B, 207C, etc.). Note that decoded data storage 207 may store intermediate data that is neither coded nor uncoded, such as run counts. In this case, decoded data storage 207 stores the data in a compact, but not entropy coded form.

Operating independently, context model 206 is coupled to receive the previously decoded data from decoded data storage 207 (i.e., 207A, 207B, 207C, etc.) in response to a feedback signal it sends to decoded data storage 207. Therefore, two independent feedback loops exist, one between decoder 205 and input buffer 204 and a second between context model 206 and decoder data storage 207. Since the large feedback loop is eliminated, the decoders in decoder 205 (e.g., 205A, 205B, 205C, etc.) are able to decode their associated codewords as soon as they are received from input buffer 204.

The context model provides the memory portion of the coding system and divides a set of data (e.g., an image) into different categories (e.g., context bins) based on the memory. In the present invention, the context bins are considered independent ordered sets of data. In one embodiment, each group of context bins has its own probability estimation model and each context bin has its own state (where probability estimation models are shared). Therefore, each context bin could use a different probability estimation model and/or bit-stream generator.

Thus, the data is ordered, or parallelized, and portions of the data stream are assigned to individual coders for decoding.

Adding Parallelism to the Classic Entropy Coding Model

To parallelize the data stream, the data may be divided according to either context, probability or by tiling, etc. A parallel encoder portion of an encoding system of the present invention fed by data differentiated by context model (CM) is shown in FIG. 2B.

Figure 2B:
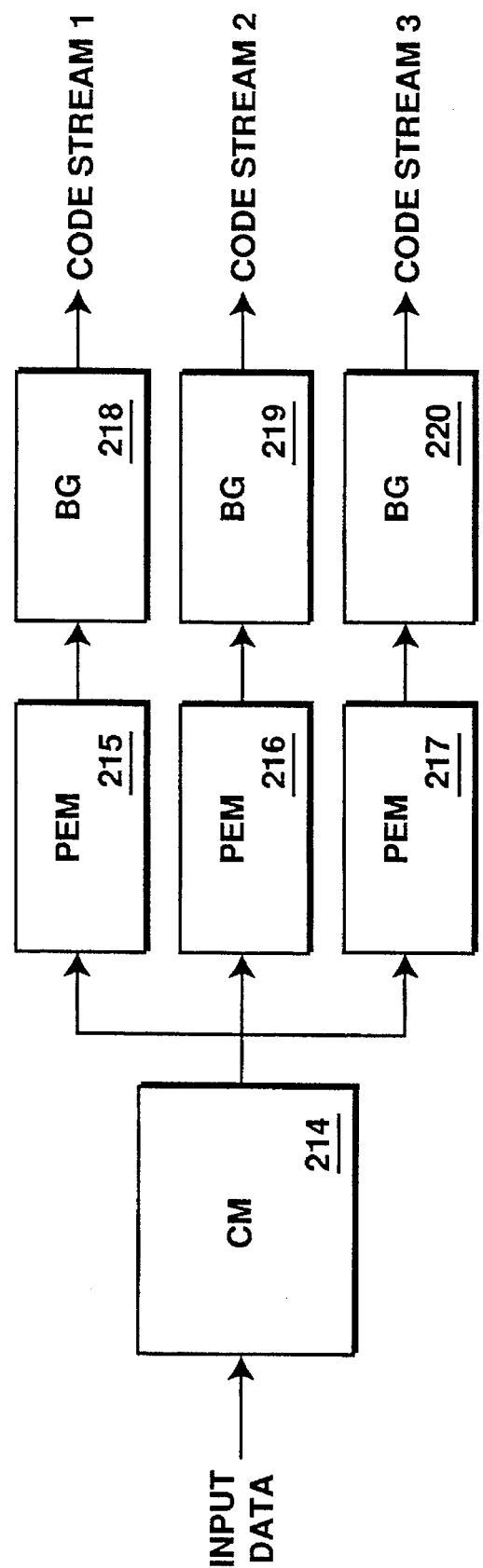
FIG. 2B is a block diagram of one embodiment of the encoding system of the present invention.

Referring to FIG. 2B, the context dependent parallel encoder portion comprises context model (CM) 214, probability estimation modules (PEMs) 215–217, and bitstream generators (BGs) 218–220. CM 214 is coupled to receive coded input data. CM 214 is also coupled to PEMs 215–217. PEMs 215–217 are also coupled BGs 218–220, respectively, which output code streams 1, 2 and 3 respectively. Each PEM and BG pair comprises a coders. Therefore, the parallel encoder is shown with three coders. Although only three parallel codes are shown, any number of coders may be used.

CM 214 divides data stream into different contexts in the same way as a conventional CM and sends the multiple streams to the parallel hardware encoding resources. Individual contexts, or groups of contexts, are directed to separate probability estimators (PEMs) 215–217 and bit generators (BGs) 218–219. Each of BGs 218–220 outputs a coded data stream.

FIG. 2C is a block diagram of one embodiment of the decoder portion of the decoding system of the present invention. Referring to FIG. 2C, a context dependent parallel decoder is shown having BGs 221–223, PEMs 224–226 and CM 227. Code streams 1–3 are coupled to BGs 221–223 respectively. BGs 221–223 are also coupled to PEMs 224–226 respectively. PEMs 224–226 are coupled to CM 227 which outputs the reconstructed input data. The input comes from several code streams, shown as code streams 1–3. One code stream is assigned to each PEM and BG. Each of the BG 221–223 returns a bit representing whether the binary decision is in its more probable state, which the PEMs 224–226 use to return decoded bits (e.g., the binary decision). Each of PEMs 224–226 is associated with one of BGs 221–223, indicating which code is to be used to produce a data stream from its input code stream. CM 227 produces a decoded data stream by selecting the decoded bits from the bit-stream generators in the proper sequence, thereby recreating the original data. Thus, the CM 227 obtains the decompressed data bit from the appropriate PEM and BG, in effect reordering the data into the original order. Note that the control for this design flows in the reverse direction of the data stream. The BG and PEM may decode data before the CM 227 needs it, staying one or more bits ahead. Alternatively, the CM 227 may request (but not receive) a bit from one BG and PEM and then request one or more bits from other BGs and PEMs before using the initially requested bit.

The configuration shown in FIG. 2C is designed to couple the PEM and BG tightly. The IBM Q-Coder is a good example of a coder having a tightly coupled PEM and BG. Local feedback loops between these two are not fundamental limit to system performance.

In a different design, the PEM could differentiate the data and send it to parallel BG units. Thus, there would be only one CM and PEM and the BG is replicated. Adaptive Huffman coding and finite state machine coding could be used in this way.

Figure 2D:
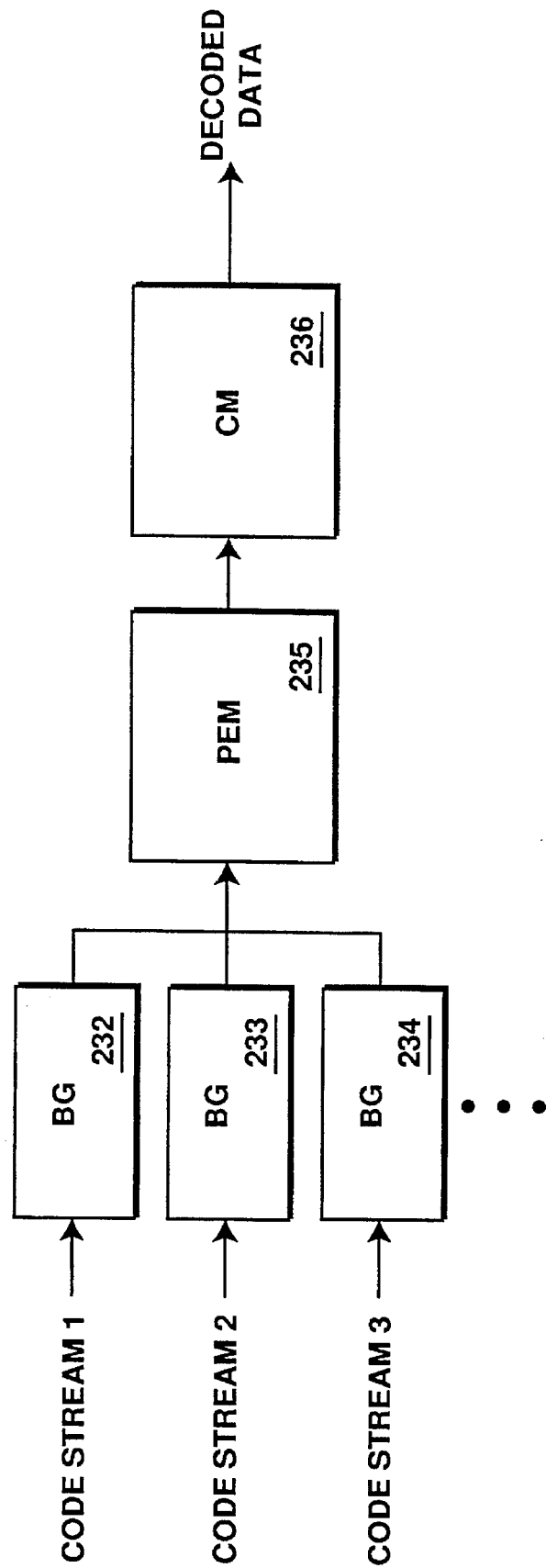
FIG. 2D is a block diagram of one embodiment of the decoding system of the present invention which processes probability classes in parallel.

A similar decoding system that uses the PEM to differentiate the data and send it to parallel BGs is shown in FIG. 2D. In this case, probability classes are handled in parallel and each bit-stream generator is assigned to a specific probability class and receives knowledge of the result. Referring to FIG. 2D, the coded data streams 1–3 are coupled to one of multiple bit-stream generators (e.g., BG 232, BG 233, BG 234, etc.), which are coupled to receive it. Each of the bit-stream generators is coupled to PEM 235. PEM 235 is also coupled to CM 236. In this configuration, each of the bit-stream generators decodes coded data and the results of the decoding are selected by PEM 235 (instead of by CM 236). Each of the bit-stream generator receives coded data from a source associated with one probability class (i.e., where the coded data could from any context bin). PEM 235 selects the bit-stream generators using a probability class. The probability class is dictated by the context bin provided to it by CM 236. In this manner, decoded data is produced by processing probability classes in parallel.

Numerous implementations exist for the parallel decoding systems of the present invention. In one embodiment, the coded data streams corresponding to the multiple context bins can be interleaved into one stream ordered by the demands of the various coders. In the currently preferred embodiment of the present invention, the coded data is ordered such that each coder is constantly supplied with data even though the coded data is delivered to the decoder in one stream. Note that the present invention operates with all types of data, including image data.

By using small simple coders that can be cheaply replicated in integrated circuits, coded data can be decoded quickly in parallel. In one embodiment, the coders are implemented in hardware using field programmable gate array (FPGA) chips or a standard cell application specific integrated circuit (ASIC) chip. The combination of parallelism and simple bit-stream generators allow the decoding of coded data to occur at speeds in excess of the prior art decoders, while maintaining the compression efficiency of the prior art decoding systems.

Channel Ordering of Multiple Data Streams

There are many different design issues and problems that affect system performance. A few of these will be mentioned below. However, the designs shown in FIG. 2B and 2C (and 2D) use the multiple code streams. Systems with parallel channels that could accommodate this design are imaginable: multiple telephone lines, multiple heads on a disk drive, etc. In some applications, only one channel is available, or convenient. Indeed, if multiple channels are required there may be poor utilization of the bandwidth because of the bursty nature of the individual code streams.

In one embodiment, the code streams are concatenated and sent contiguously to the decoder. A preface header contains pointers to the beginning bit location of each stream. FIG. 3 illustrates one embodiment of the arrangement of this data. Referring to FIG. 3, three pointers 301–303 indicate the starting location in the concatenated code of code streams 1, 2 and 3 respectively. The complete compressed data file is available in a buffer to the decoder. As needed, the codewords are retrieved from the proper location via the proper pointer. The pointer is then updated to the next codeword in that code stream.

Note that this method requires an entire coded frame to be stored at the decoder and, for practical purposes, at the encoder. If a real-time system, or less bursty data flow, is required then two frame buffers may be used for banking at both the encoder and the decoder.

Data Order to Codeword Order

Notice that a decoder decodes codewords in a given deterministic order. With parallel coding, the order of the requests to the code stream is deterministic. Thus, if the codewords from parallel code streams can be interleaved in the right order at the encoder, then a single code stream will suffice. The codewords are delivered to the decoder in the same order on a just-in-time basis. At the encoder, a model of the decoder determines the codeword order and packs the codewords into a single stream. This model might be an actual decoder.

A problem with delivering data to the parallel decoding elements arises when data is variable length. Unpacking a stream of variable length codewords requires using a bit shifter to align the codewords. Bit shifters are often costly and/or slow when implemented in hardware. The control of the bit shifter depends on the size of the particular codeword. This control feedback loop prevents variable length shifting from being performed quickly. The virtues of feeding multiple decoders with a single stream cannot be realized if the process of unpacking the stream is performed in a single bit shifter that is not fast enough to keep up with the multiple decoders.

The solution offered in this invention separates the problem of distributing the coded data to the parallel coders from the alignment of the variable-length codewords for decoding. The codewords in each independent code stream are packed into fixed-length words, called interleaved words. At the decoder end of the channel these interleaved words can be distributed to the parallel decoder units with fast hard-wired data lines and a simple control circuit.

It is convenient to have the interleaved word length larger than the maximum codeword length so that at least enough bits to complete one codeword is contained in each interleaved word. The interleaved words can contain may codewords and parts of codewords. FIG. 4 illustrates the interleaving of an example set of parallel code streams.

These words are interleaved according to the demand at the decoder. Each independent decoder receives an entire interleaved word. The bit shifting operation is now done locally at each decoder, maintaining the parallelism of the system. Note in FIG. 4 that the first codeword in each interleaved word is the lowest remaining codeword in the set. For instance, the first interleaved words come from code stream 1, starting with the lowest codeword (i.e., #1 ). This is followed by the first interleaved word in code stream 2 and then by the first interleaved word in code stream 3. However, the next lowest codeword is no. 7. Therefore, the next word in the stream is the second interleaved word of code stream 2.

Using the actual decoder as the modeler for the data stream accounts for all design choices and delays to create the interleaved stream. This is not a great cost for duplex systems that have both encoders and decoders anyway. Note that this can be generalized to any parallel set of variable-length (or different sized) data words that are consumed in a deterministic order.

Types of Codes and Bit-Stream Generators for Parallel Decoding

The present invention could employ existing coders, such as Q-coders or B-coders, as the bit-stream generation elements which are replicated in parallel. However, other codes and coders may be used. The coders and their associated codes employed by the present invention are simple coders.

In the present invention, using a bit-stream generator with a simple code instead of complex code, such as the arithmetic code used by the Q-coder or the multi-state codes used by the B-coder, offers advantages. A simple code is advantageous in that the hardware implementation is much faster and simpler and requires less silicon than a complex code.

Another advantage of the present invention is that coding efficiency can be improved. A code that uses a finite amount of state information cannot perfectly meet the Shannon entropy limit for every probability. Codes that allow a single bit-stream generator to handle multiple probabilities or contexts require constraints that reduce coding efficiency. Removing the constraints needed for multiple contexts or probability classes allows the use of codes that comes closer to meeting the Shannon entropy limit.

R-codes

The code (and coder) employed by the currently preferred embodiment of the present invention is referred to as an R-codes. R-codes are adaptive codes which include run length codes (i.e., R2(k) codes). In the currently preferred embodiment, the R-codes are parameterized so that many different probabilities can be handled by a single decoder design. Moreover, the R-codes of the present invention can be decoded by simple, high-speed hardware.

Figure 1:
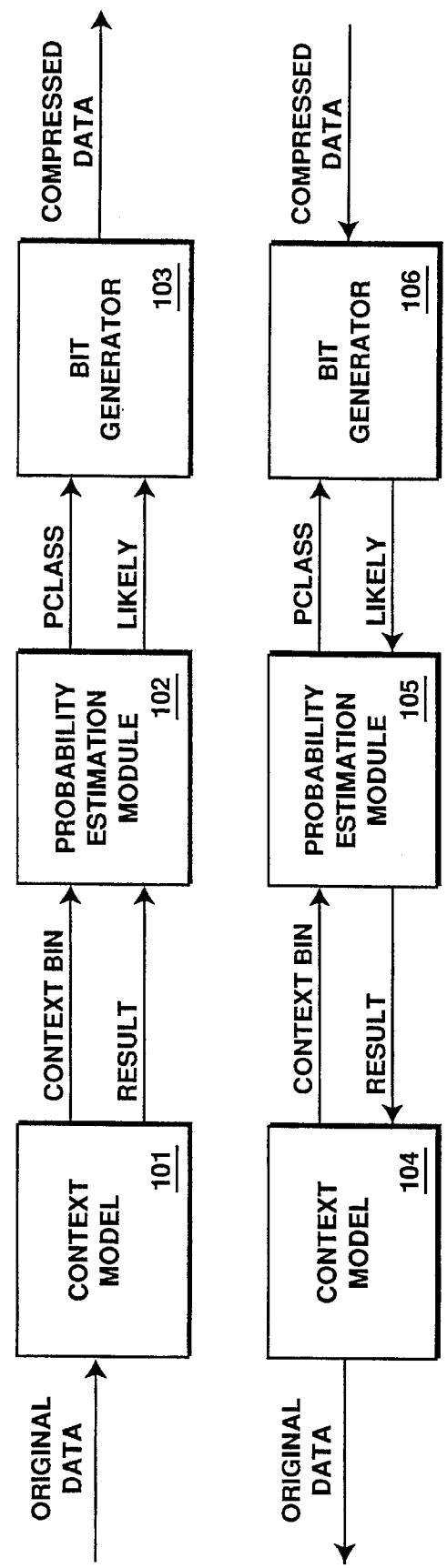
FIG. 1 is a block diagram of a prior art binary entropy encoder and decoder.

In the present invention, R-codes are used by an R-coder to perform encoding or decoding. In the currently preferred embodiment, an R-coder is a combined bit-stream generator and probability estimation module. For instance, in FIG. 1, an R-coder could include the combination of probability estimation module 102 and bit-stream generator 103 and the combination of probability estimation module 105 with bit-stream generator 106.

Codewords represent runs of the most probable symbol (MPS). A MPS represents the outcome of a binary decision with more than 50% probability. On the other hand, the least probable symbol (LPS) represents the outcome in a binary decision with less than 50% probability. Note that when two outcomes are equally probable, it is not important which is designated MPS or LPS as long as both the encoder and decoder make the same designation. The resulting bit sequence in the compressed file is shown in Table 1, for a given parameter referred to as MAXRUN.

TABLE 1

| Codeword | Bit-generation Encoding Meaning |
|---|---|
| 0 | MAXRUN Consecutive MPSs |
| 1N | N Consecutive MPSs followed by LPS, N<MAXRUN |

To encode, the number of MPSs in a run are counted by a simple counter. If that count equals the MAXRUN count value, a 0 codeword is emitted into the code stream and the counter is reset. If an LPS is encountered, then a 1 followed by the bits N, which uniquely describe the number of MPS symbols before the LPS, is emitted into the code stream. (Note that there are many ways to assign the N bits to describe the run length). Again the counter is reset. Note that the number of bits needed for N is dependent on the value of MAXRUN. Also note that the 1's complement of the codewords could be used.

To decode, if the first bit in the code stream is 0, then the value of MAXRUN is put in the MPS counter and the LPS indication is cleared. Then the 0 bit is discarded. If the first bit is a 1, then the following bits are examined to extract the bits N and the appropriate count (N) is put in the MPS counter and the LPS indicator is set. Then the code stream bits containing the 1N codeword are discarded.

R-codes are generated by the rules in Table 1. Note that the definition of a given R-code Rx(k) is defined by the MAXRUN. For instance:

MAXRUN for $Rx(k) = x * 2^{k-1}$, thus

MAXRUN for $R2(k) = 2 * 2^{k-1}$,

MAXRUN for $R3(k) = 3 * 2^{k-1}$, etc . . . .

Note that R-codes are an extension of Golomb codes. Golomb codes use R2(•) codes only. The R-codes of the present invention allow the use of both R2(k) and R3(k) codes, and other Rn(k) codes if desired. In one embodiment, R2(k) and R3(k) codes are used. Note that Rn exists for n=2 and n equals any odd number (e.g., R2, R3, R5, R7, R9, R11, R13, R15). In one embodiment, for R2(k) code, the run count, r, is encoded in N; the run count, r, is described in k bits, such that 1N is represented with k+1 bits. Also in one embodiment, for an R3(k) code, the bits N can contain 1 bit to indicate if $n<2^{(k-1)}$ or $n \geq 2^{(k-1)}$ and either k−1 or k bits to indicate the run count, r, such that the variable N is represented by a total k or k+1 bits respectively. In other embodiments, the 1's complement of N could be used in the codeword. In this case, the MPS tends to produce code streams with many 0s and LPS tends to produce code streams with many 1s.

Tables 2, 3, 4 and 5 depict some efficient R-codes utilized for the current preferred embodiment of the present invention. It should be noted that other run length codes may also be used in the present invention. An example of alternative run length code for R2(2) is shown in Table 6. Tables 7A and 8A show examples of the codes used in the preferred embodiment.

TABLE 2

R2(0)
p(0) = 0.500

| uncoded data | codeword |
|---|---|
| 0 | 0 |
| 1 | 1 |

TABLE 3

R2(1)
p(0) = 0.707

| uncoded data | codeword |
|---|---|
| 00 | 0 |
| 01 | 10 |
| 1 | 11 |

TABLE 4

R3(1)
p(0) = 0.794

| uncoded data | codeword |
|---|---|
| 000 | 0 |
| 001 | 100 |
| 01 | 101 |
| 1 | 11 |

TABLE 5

R2(2)
p(0) = 0,841

| uncoded data | codeword |
|---|---|
| 0000 | 0 |
| 0001 | 100 |
| 001 | 101 |
| 01 | 110 |
| 1 | 111 |

TABLE 6

Alternative R2(2)

| Alternative | R2(2) |
|---|---|
| 0000 | 0 |
| 0001 | 111 |
| 001 | 101 |
| 01 | 110 |
| 1 | 100 |

TABLE 7A

Preferred R3(2) Code

| Preferred | R3(2) |
|---|---|
| 000000 | 0 |
| 000001 | 1000 |
| 00001 | 1010 |
| 0001 | 1001 |
| 001 | 1011 |
| 01 | 110 |
| 1 | 111 |

TABLE 8A

Preferred R2(2) Code

| Preferred | R2(2) |
|---|---|
| 0000 | 0 |
| 0001 | 100 |
| 001 | 110 |
| 01 | 101 |
| 1 | 111 |

Probability Estimation Model for R-Codes

In the currently preferred embodiment, the R2(0) code performs no coding: an input of 0 is encoded into a 0 and an input of 1 is encoded into a 1 (or vice versa) and is optimal for probabilities equal to 50%. In the currently preferred embodiment, an R3(0) code is not utilized. The R2(1) code of the currently preferred embodiment is optimal for probabilities equal to 0.707 (i.e., 70.7%) and the R3(1) is optimal for the 0.794 probability (79.4%). The R2(2) code is optimal for the 0.841 probability (84.1%). Table 7B below depicts the near-optimal run-length code, where the probability skew is defined by the following equation:

Probability skew=$-\log_2$ (LPS).

TABLE 7B

| probability | probability skew | Best Golomb Code |
|---|---|---|
| .500 | 1.00 | R2(0) |
| .707 | 1.77 | R2(1) |
| .841 | 2.65 | R2(2) |
| .917 | 3.59 | R2(3) |
| .958 | 4.56 | R2(4) |
| .979 | 5.54 | R2(5) |
| .989 | 6.54 | R2(6) |
| .995 | 7.53 | R2(7) |
| .997 | 8.53 | R2(8) |
| .999 | 9.53 | R2(9) |

Note that the codes are near-optimal in that the probability range, as indicated by the probability skew, is covering the space relatively evenly even though the optimal probabilities do not differentiate as much in the higher k values as in the lower k values.

An R2(k) for a fixed k is called a run-length code. However, a fixed k is only near-optimal for a fixed probability. It is noted that when coding at an optimal probability, an R-code according to the present invention uses a 0 and 1N codewords with equal frequency. In other words, half the time, the R-coder of the present invention outputs one code and the other half of the time, the R-coder outputs the other. By examining the number of 0 and 1N codewords, a determination can be made as to whether the best code is being used. That is, if too many 1N codewords are being output, then the run-length is too long; on the other hand, if too many 0 codewords are being output, then the run length is too short.

The probability estimation model used by Langdon examines the first bit of each codeword to determine whether the source probability is above or below the current estimate. Based on this determination, k is increased or decreased. For example, if a codeword indicating MPS is seen, the probability estimate is too low. Therefore, according to Langdon, k is increased by 1 for each 0 codeword. If a codeword indicating less than MAXRUN MPS followed by an LPS is seen, the probability estimate is too high. Therefore, according to Langdon, k is decreased by 1 for each 1N codeword.

The present invention allows more complex probability estimation than the simple increase or decrease of k by 1 every codeword. The present invention includes a probability estimation module state that determines the code to use. Many states may use the same code. Codes are assigned to states using a state table or state machine.

In the present invention, the probability estimate changes state every codeword output. Thus, in the present invention, the probability estimation module increases or decreases the probability estimate depending on whether a codeword begins with a 0 or a 1. For instance, if a "0" codeword is output, an increase of the estimate of the MPS probability occurs. On the other hand, if a "1" codeword is output, the estimate of MPS probability is decreased.

The Langdon coder of the prior art only used R2(k) codes and increased or decreased k for each codeword. The present invention, alternatively, uses R2(k) and R3(k) codes, in conjunction with the state table or state machine, to allow the adaptation rate to be tuned to the application. That is, if there is a small amount of stationary data, adaptation must be quicker to result in more optimal coding, and where there is a larger amount of stationary data, the adaptation time can be longer so that the coding can be chosen to achieve better compression on the remainder of the data. Note that where variable numbers of state changes can occur, application specific characteristics may also influence the adaptation rate. Because of the nature of the R-codes, the estimation for R-codes is simple and requires little hardware, while being very powerful.

The incorporation of the R3(k) codes allows more probability space to be covered with a finer resolution. An example probability estimation state table according to the present invention is shown in FIG. 5. Referring to FIG. 5, the probability estimation state table shows both a state counter and the code associated with each of the separate states in the table. Note that the table includes both positive and negative states. The table is shown having 37 positive state and 37 negative states, including the zero states. The negative states signify a different MPS than the positive states. In one embodiment, the negative states can be used when the MPS is 1 and the positive states can be used when the MPS is 0, or vice versa. Note that the table shown in FIG. 5 is an example only and that other tables might have more or less states and a different state allocation.

Initially, the coder is in state 0 which is the R2(0) code (i.e., no code) for probability estimate equal to 0.50. After each codeword is processed, the state counter is incremented or decremented depending on the first bit of the codeword. In the currently preferred embodiment, a codeword of 0 increases the magnitude of a state counter; a codeword stating with 1 decreases the magnitude of the state counter. Therefore, every codeword causes a change to be made in the state by the state counter. In other words, the probability estimation module changes state. However, consecutive states could be associated with the same code. In this case, the probability estimation is accomplished without changing codes every codeword. In other words, the state is changed for every codeword; however, the state is mapped into the same probabilities at certain times. For instance, states 5 to −5 all use the R2(0) code, while states 6 through 11 and −6 through −11 use the R2(1) code. Using the state table of the present invention, probability estimation is allowed to stay with the same coder in a non-linear manner.

It should be noted that more states with the same R-code are included for the lower probabilities. This is done because the loss of efficiency when using the wrong code at low probabilities is great. The nature of the run length codes state table is to transfer between states after each codeword. In a state table designed to change codes with every change in state, when toggling between states at the lower probabilities, the code toggles between a code which is very close to the entropy efficiency limit and code which is far from the entropy efficiency limit. Thus, a penalty (in terms of the number of coded data bits) can result in the transition between states. Prior art probability estimation modules, such as Langdon's probability estimation module, lose performance because of this penalty.

In the higher probability run length codes, the penalty for being in the wrong code is not as great. Therefore, in the present invention, additional states are added at the lower probabilities, so that the changes of toggling between the two correct states are increased, thereby reducing the coding inefficiency.

Note that in certain embodiments, the coder may have initial probability estimate state. In other words, the coder could start in a predetermined one of the states, such as state 18. In one embodiment, a different state table could be used so that some states would be used for the first few symbols to allow for quick adaptation, and a second state table could be used for the remaining symbols for slow adaptation to allow fine-tuning of the probability estimate. In this manner, the coder may be able to use a more optimal code sooner in the coding process. In another embodiment, the code stream could specify an initial probability estimate for each context. In one embodiment, the increments and decrements are not made according to a fixed number (e.g., 1). Instead, the probability estimate state can be incremented by a variable number according to the amount of data already encountered or the amount of change in the data (stability).

If the state table is symmetric, as the example table of FIG. 5 shows, only half of it (including the zero state) needs to be stored or implemented in hardware. In one embodiment, the state number is stored in sign magnitude (1s) complement form to take advantage of the symmetry. In this manner, the table can be utilized by taking the absolute value of the ones complement number to determine the state and examining the sign to determine whether the MPS is a 1 or 0. This allows the hardware needed for incrementing and decrementing the state to be reduced because the absolute value of the state is used to index the table and the computation of the absolute value of ones complement number is trivial. In another embodiment, for greater hardware efficiency, a state table can be replaced by a hardwired or programmable state machine. A hardwired state to code converter is the currently preferred implementation of the state table.

One Embodiment of the Decoder System of the Present Invention

Figure 6:
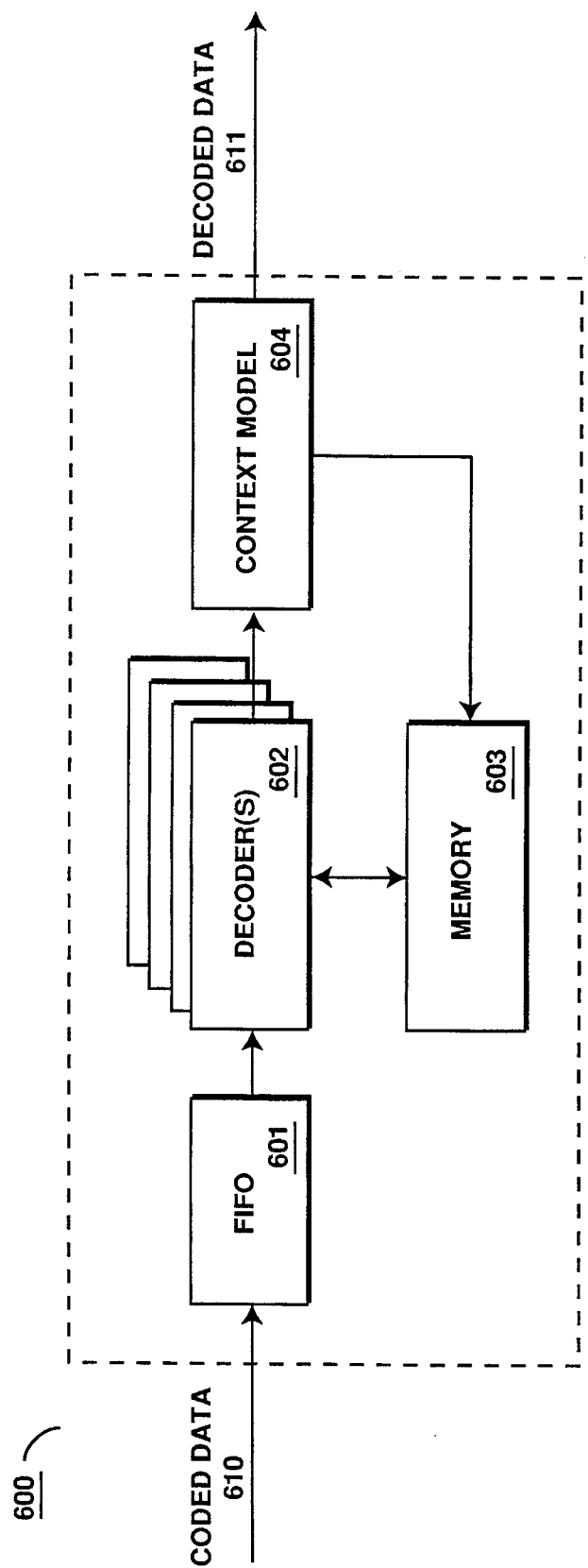
FIG. 6 is a block diagram of one embodiment of the decoding system of the present invention.

FIG. 6 illustrates a block diagram of one embodiment of the decoder hardware system of the present invention. Referring to FIG. 6, the decoder system 600 includes first-in/first-out (FIFO) buffer 601, decoders 602, memory 603, and context model 604. Decoders 602 includes multiple decoders. Coded data 610 is coupled to be received by FIFO 601. FIFO 610 is coupled to supply the coded data to decoder 602. Decoders 602 are coupled to memory 603 and context model 604. Context model 604 is also coupled to memory 603. One output of context model 604 comprises the decoded data 611.

In system 600, the coded data 610 input into FIFO 601 is ordered and interleaved. FIFO 601 contains data in proper order. The streams are delivered to decoders 602. Decoders 602 requires data from these streams in a serial and deterministic order. Although the order in which decoders 602 require the coded data is non-trivial, it is not random. By ordering the codewords in this order at the encoder instead of the decoder, the coded data can be interleaved into a single stream. In another embodiment, coded data 610 may comprise a single stream of non-interleaved data, where data for each context bin, context class or probability class is appended onto the data stream. In this case, FIFO 610 is replaced by a storage area 610 to receive all of the coded data prior to forwarding the data to decoders 602 so that the data may be segmented properly.

As the coded data 610 is received by FIFO 601, context model 604 determines the current context bin. In one embodiment, context model 604 determines the current context bin based on previous pixels and/or bits. Although not shown, line buffering may be included for context model 604. The line buffering provides the necessary data, or template, by which context model 604 determines the current context bin. For example, where the context is based on pixel values in the vicinity of the current pixel, line buffering may be used to store the pixel values of those pixels in the vicinity that are used to provide the specific context.

In response to the context bin, the decoder system 600 fetches the decoder state from memory 603 for the current context bin. In one embodiment, the decoder state includes the probability estimation module (PEM) state and the bit generator state. The PEM state determines which code to use to decode new codewords. The bit generator state maintains a record of the bits in the current run. The state is provided to decoders 602 from memory 603 in response to an address provided by context model 604. The address accesses a location in memory 603 that stores the information corresponding to the context bin.

Once the decoder state for the current context bin has been fetched from memory 603, system 600 determines the next uncompressed bit and processes the decoder state. Decoders 602 then decode the new codeword, if needed, and/or updates the run count. The PEM state is updated, if needed, as well as the bit generation state. Decoders 602 then write the new coder state into memory 603.

Figure 7:
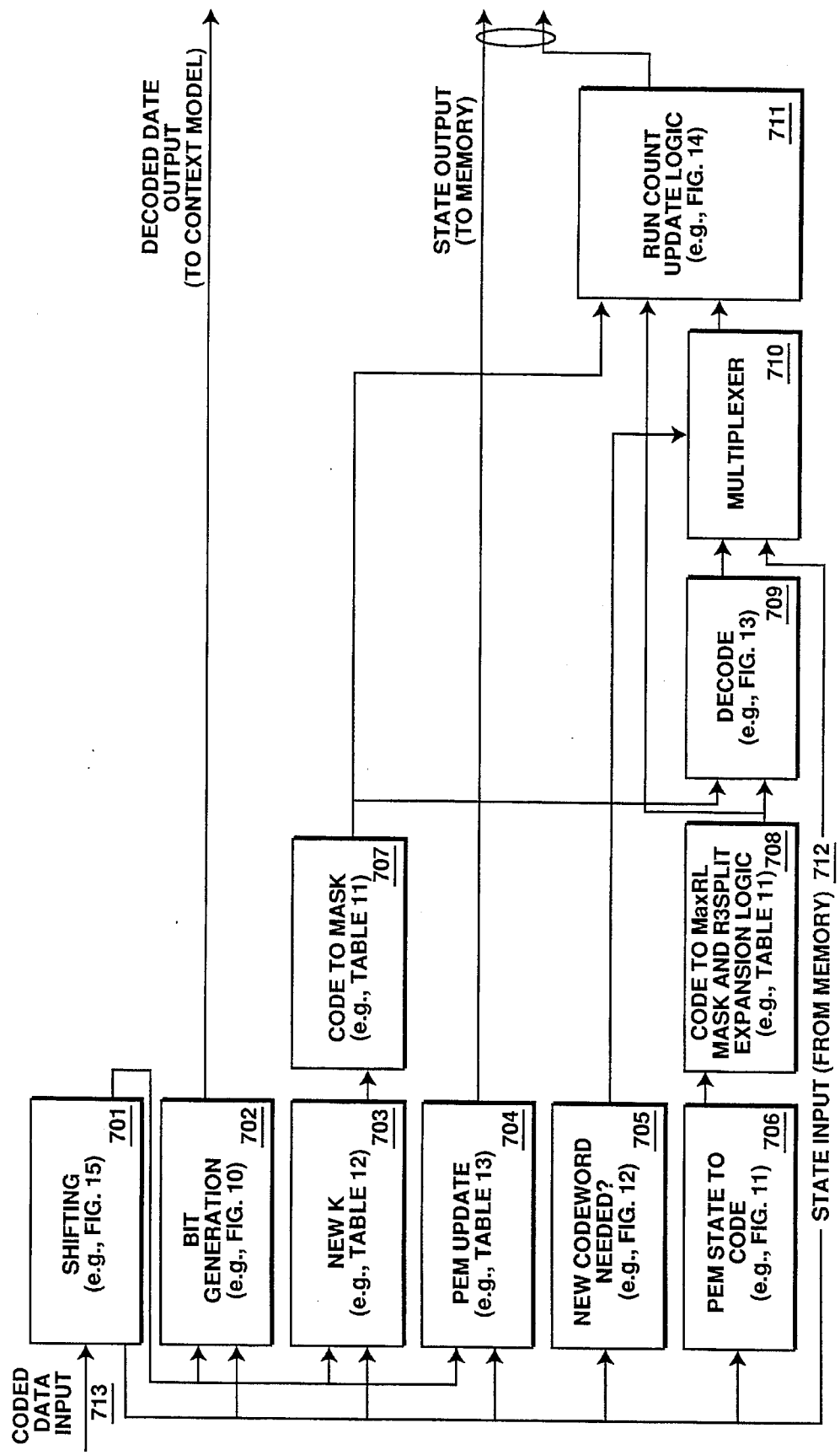
FIG. 7 is a block diagram of one embodiment of a decoder of the present invention.

FIG. 7 illustrates one embodiment of a decoder of the present invention. Referring to FIG. 7, the decoder includes shifting logic 701, bit generator logic 702, "New k" logic 703, PEM update logic 704, New codeword logic 705, PEM state to cache logic 706, code-to-mask logic 707, code-to-MaxPL, Mask, and R3Split expansion logic 708, decode logic 709, multiplexer 710, and run count update logic 711. Shifting logic 701 is coupled to receive the coded data input 713, as well as the state input 712 (from memory). The output of shifting logic 701 is also coupled as an input to bit generation logic 702, "new-k" generation logic 703 and PEM update logic 704. Bit generation logic 702 is also coupled to receive the state input 712 and generates the decoded data output to the context model. New-k logic 703 generates an output that is coupled to an input of code-to-mask logic 707. PEM update logic 704 is also coupled to state input 712 and generates the state output (to memory). State input 712 is also coupled to inputs of new-codeword logic 705 and PEM state-to-code logic 706. The output of PEM state-to-code logic 706 is coupled to be received by expansion logic 708. The output of expansion logic 708 is coupled to decode logic 709 and run count update logic 711. Another input to decode logic is coupled to the output of code-to-mask 707. The output of decode logic 709 is coupled to one input of MUX 710. The other input of MUX 710 is coupled to state input 712. The selection input of MUX 710 is coupled to the output of new codeword logic 705. The output of MUX 710 and expansion logic 708 are coupled to two inputs of run count update logic 711 with the output of code-to-mask logic 707. The output of run count update logic 711 is included in the state output to memory.

Shifting logic 701 shifts in data from the code data stream. Based on the coded data input and state input, bit generation logic 702 generates decoded data to the context model. New-k logic 703 also uses the shifted in data and the state input to generate a new value of k. In one embodiment, new-k logic 703 uses the PEM state and the first bit of coded data to generate the new value of k. Based on the new k value, code-to-mask logic 707 generates a RLZ mask for the next codeword. The RLZ mask for the next codeword is sent to decode logic 709 and the run count update logic 711.

The PEM update logic 704 updates the PEM state. In one embodiment, the PEM state is updated using the present state. The updated state is sent to memory. New codeword logic 705 determines if a new codeword is needed. PEM state-to-code logic 706 determines the code for decoding using the state input 712. The code is input to expansion logic 708 to generate the maximum run length, the current mask and an R3 split value. Decode logic 709 decodes the codeword to produce a run count output. MUX 710 selects either the output from decode logic 709 or the state input 712 to the run count update logic 711. Run count update logic 711 updates the run count.

Figure 8:
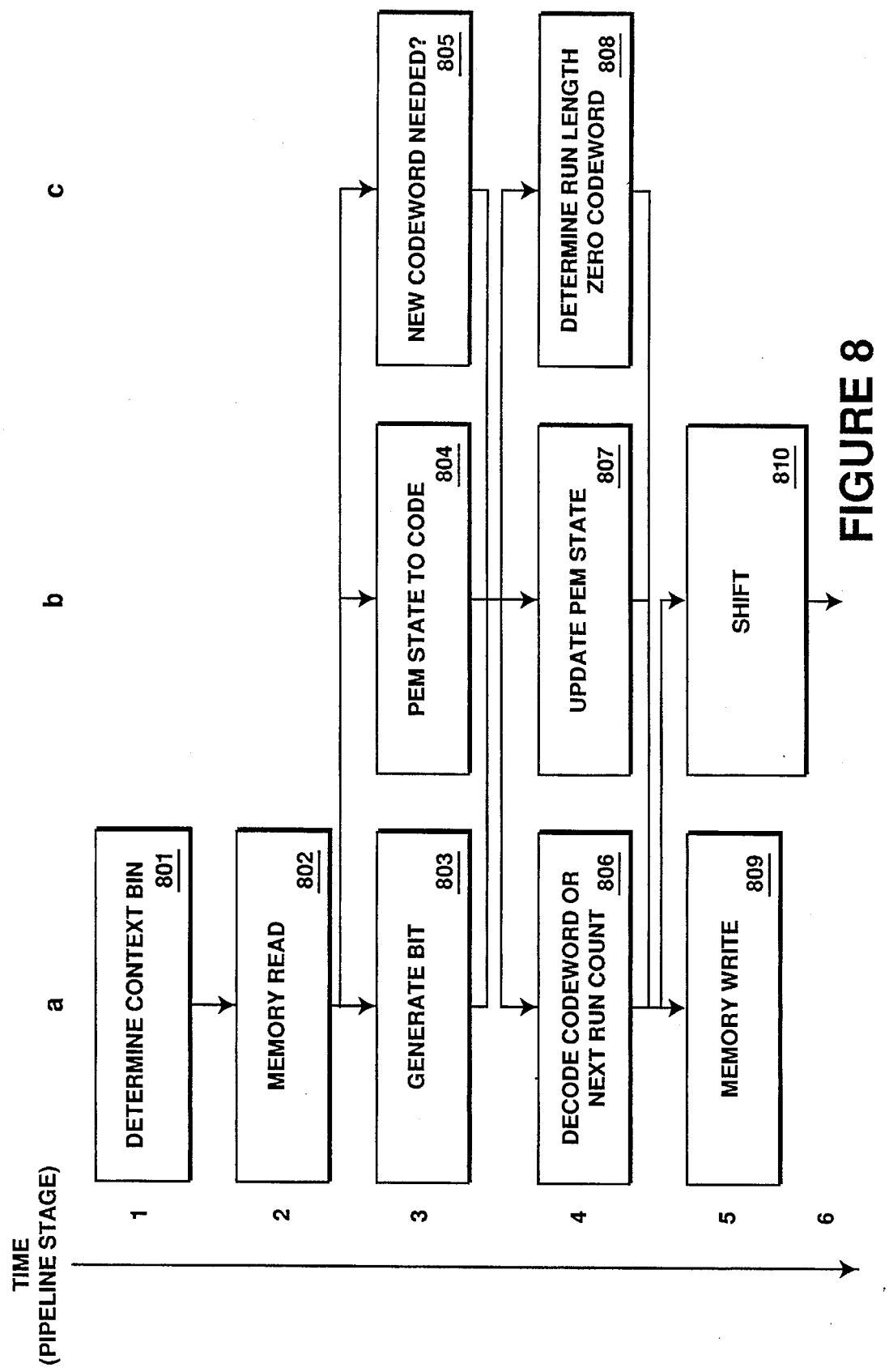
FIG. 8 illustrates one embodiment of the decoding pipeline of the present invention.

The decoding system 600, including decoder 700, of the present invention operates in a pipelined manner. In one embodiment, the decoding system 600 of the present invention determines context bins, estimates probabilities, decodes codewords, and generates bits from run counts all in a pipelined manner. The pipelined decoding process may be used in conjunction with the parallel decoding systems and encoding systems described in U.S. Pat. No. 5,381,145 entitled "Method and Apparatus For Parallel Decoding and Encoding of Data", filed Feb. 10, 1993, assigned to the corporate assignee of the present invention and incorporated herein. One embodiment of the pipeline structure of the decoding system is depicted in FIG. 8. Referring to FIG. 8, an embodiment of the pipelined decoding process of the present invention is shown in six stages, numbered 1–6.

In the first stage, the current context bin is determined (801). In the second stage, after the context bin has been determined, a memory read occurs (802) in which the current decoder state for the context bin is fetched from memory. As stated above, the decoder state includes the PEM state and the bit generator state.

In the third stage of the pipelined decoding process of the present invention, a decompressed bit is generated (803). This allows for a bit to be available to the context model. Two other operations occur during the third stage. The PEM state is converted into a code type (804) and a determination is made as to whether a new codeword must be decoded (805) also occur in the third stage.

During the fourth stage, the decoding system processes a codeword and/or updates the run count (806). Several sub-operations are involved in processing a codeword and updating the run count. For instance, a codeword is decoded to determine the next run count or the run count is updated for the current codeword (806). If needed when decoding new codewords, more coded data is fetched from the input FIFO. Another sub-operation that occurs in the fourth stage is the updating of the PEM state (807). Lastly, in the fourth stage of the decoding pipeline, the new PEM state is used to determine what the run length zero codeword (described later) is for the next code if the run count of the current code word is zero (808).

During the fifth stage of the decoding pipeline of the present invention, the decoder state with an updated PEM state is written into memory (809) and the shifting begins for the next codeword (810). In the sixth stage, the shifting to the next codeword is completed (810).

The pipelined decoding of the present invention actually begins with a decision as to whether to start the decoding process. This determination is based on whether there is enough data in the FIFO to present to the decoder of the present invention. If there is not enough data from the FIFO, the decoding system is stalled. In another case, the decoding system may be stalled when outputting decoded data to a peripheral device that is not capable of receiving all of the data output from the decoder as it is being generated. For instance, when the decoder is providing output to a video display interface and its associated video circuitry, the video may be too slow, such that the decoder needs to be stalled to allow a video to catch up.

Figure 9:
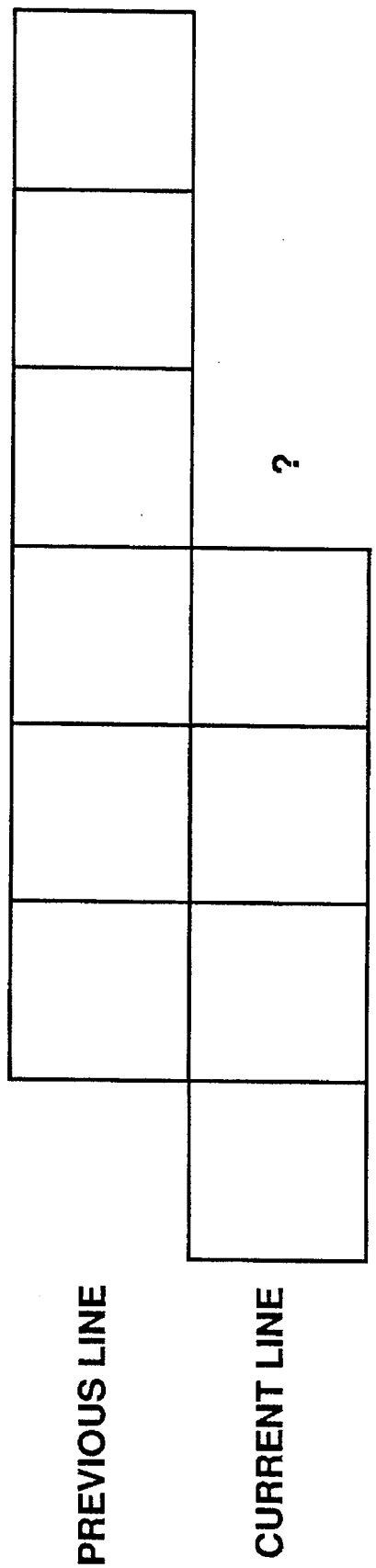
FIG. 9 illustrates one example of a context model template used by the present invention.

Once the decision has been made to start the decoding process, the current context bin is determined by the context model. In the present invention, the current context bin is ascertained by examining previous data. Such previous data may be stored in line buffers and may include data from the current line and/or previous lines. FIG. 9 illustrates one embodiment for a binary image where bits from the current and previous lines used as the context template for a given bit. Bits from line buffer(s) may be designed using a template with respect to the previous data, such that the context bin for the current data is selected according to whether the previous data being examined matches the template. These line buffers may include bit shift registers. A template may be used for each bit plane of an n-bit image.

In one embodiment, the context bin is selected by outputting an address to memory during the next pipeline stage. The address may include a predetermined number of bits, such as three bits, to identify the bit plane. By using three bits, the bit position in pixel data may be identified. The template used to determine the context may also be represented as a portion of the address. The bits used to identify the bit plane and the bits identifying the template may be combined to create an address for a specific location in memory that contains the state information for the context bin defined by those bits. For example, by utilizing three bits to determine the bit position in a particular pixel and the ten previous bits in the same position in each of the previous pixels in the template, a 13-bit context address may be generated.

Using the address created by the context model, the memory (e.g., RAM) is accessed to obtain the state information. The state includes the PEM state and the bit generation state. The PEM state includes the current probability estimate, while the bit generation state maintains a record of the bits in the current run. Where more than one state uses the same code, the PEM state may not include a probability class or code designation, but rather an index into a table, such as the table shown in FIG. 5. Also when using a table such as that shown in FIG. 5, the PEM state also provides the most probable symbol (MPS) as a means for identifying whether the current PEM state is located on the positive or negative side of the table. The bit generation state may include the count value and an indication of whether an LPS is present. In one embodiment, the MPS value for the current run is also included for decoding the next codeword. In the present invention, the bit generator state is stored in memory due to reduce the space required for run counters. If the cost of space in the system for counters for each context is low, the bit generation state does not have to be stored in memory.

In one embodiment, for each context bin, memory contains the following state information:

(1) the current run count or a run length zero (RLZ) mask;

(2) a bit to indicate if there is a LPS at the end of the run;

(3) the current value of the MPS;

(4) a PEM state including the value of the MPS for the next codeword;

(5) a continue bit.

As will be described later, the continue bit and the RLZ mask allow for increased bit generation speed. The continue bit and the RLZ mask may not be required in other implementations. The continue bit and the RLZ mask will be discussed in more detail below.

Two examples of implementations of state information for a context bin, including the number of bits used to represent them, are shown in Table 8B.

TABLE 8B

| Name | Number of Bits Per Context Bin | |
|---|---|---|
| | RS(12,7) Bits | RS(7,5) Bits |
| Continue | 1 | 1 |
| LPS present | 1 | 1 |
| MPS value | 1 | 1 |
| Count | 12 | 7 |
| PEM State | 7 | 5 |
| Total | 22 | 15 |

In one embodiment, the continue flag equals a logical 1 when a valid run count is part of the state and equals a logical 0 when either the LPS is to be output at the end of a run or when a new codeword is to be decoded. The LPS present flag equals a logical 1 when there is an LPS at the end of the current run. The count indicates the current run count when the continue flag is a logical 1 and the RLZ mask for the run length zero codeword when the continue flag is 0. The MPS value indicates whether the MPS is either "0" or "1" for the current run, while the PEM state includes the MPS value for the next codeword.

It should be noted that some initialization of the decoding system may be required before the pipelined procedure may begin. Such an initialization may include zeroing the decoder state memories. This could be accomplished by causing the context model, via one or more control signals, to generate addresses for each memory location in sequence while the bit generators and probability estimation module provide zero inputs to the memory.

In the third stage of the pipeline, after obtaining the decoder state from memory (e.g., RAM), a bit is outputted without fully decoding a codeword. In one embodiment, the present invention uses a bit (flag), referred to above as the continue bit, to indicate that the present run count for a context bin is non-zero, i.e. the run count is greater than zero. The present invention generates a bit as an output based on the state of the continue bit, whether an LPS is present at the end of the run, and whether the current codeword is a run length zero codeword. If the continue bit is true (e.g., a logical 1), thereby indicating that there is no zero run count, then the output is the MPS. Otherwise, if the continue bit is not true (e.g., a logical 0), yet the LPS is at the end of the run (e.g., a logical 1), then the LPS is emitted at the end of the run. If neither the continue bit or the indication of whether the LPS is present are true, then the coded data stream is examined for the next codeword to determine the particular bit to emit. If the current codeword is not a RLZ codeword, then the bit generated is an MPS. On the other hand, if the current codeword is a RLZ codeword, then the bit generated by the present invention is an LPS.

Table 9 is a truth table for generating bits from the state information and the result of the RLZ codeword detection. In Table 9, the "x" indicates "do not care" values.

TABLE 9

| Bit Generation Truth Table | | | |
|---|---|---|---|
| Continue | LPS Present? | RLZ Codeword? | Output |
| 1 | x | x | MPS |
| 0 | 1 | x | LPS |
| 0 | 0 | 0 | MPS |
| 0 | 0 | 1 | LPS |

In the present invention, the determination of whether a codeword is a RLZ codeword depends on the PEM state. The PEM state determines the R-code to be used and different R-codes have different RLZ codewords. In one embodiment, the RLZ codeword is comprised of "1" bits. However, the number of "1"s changes according to the current R-code. For example, the RLZ for R2(0) "1"; the RLZ for R2(1) is "11", and so on, and RLZ for R2(12) is "1111111111111".

When the continue bit is cleared, a RLZ mask is stored in the count field in the current context bin, instead of storing run counts of zero. The RLZ mask allows for fast determinations of whether sufficient "1" bits are present in the coded data to indicate a RLZ codeword. Since a RLZ codeword is comprised of at least one "1" bit, the RLZ mask can be one bit smaller than the longest RLZ codeword. In one embodiment, the RLZ mask is "000000000000" for R2(0), "000000000001" for R2(1) and R3(1), and "00000000011" for R2(2), and so on, up to "111111111111" for R2(12).

Figure 10:
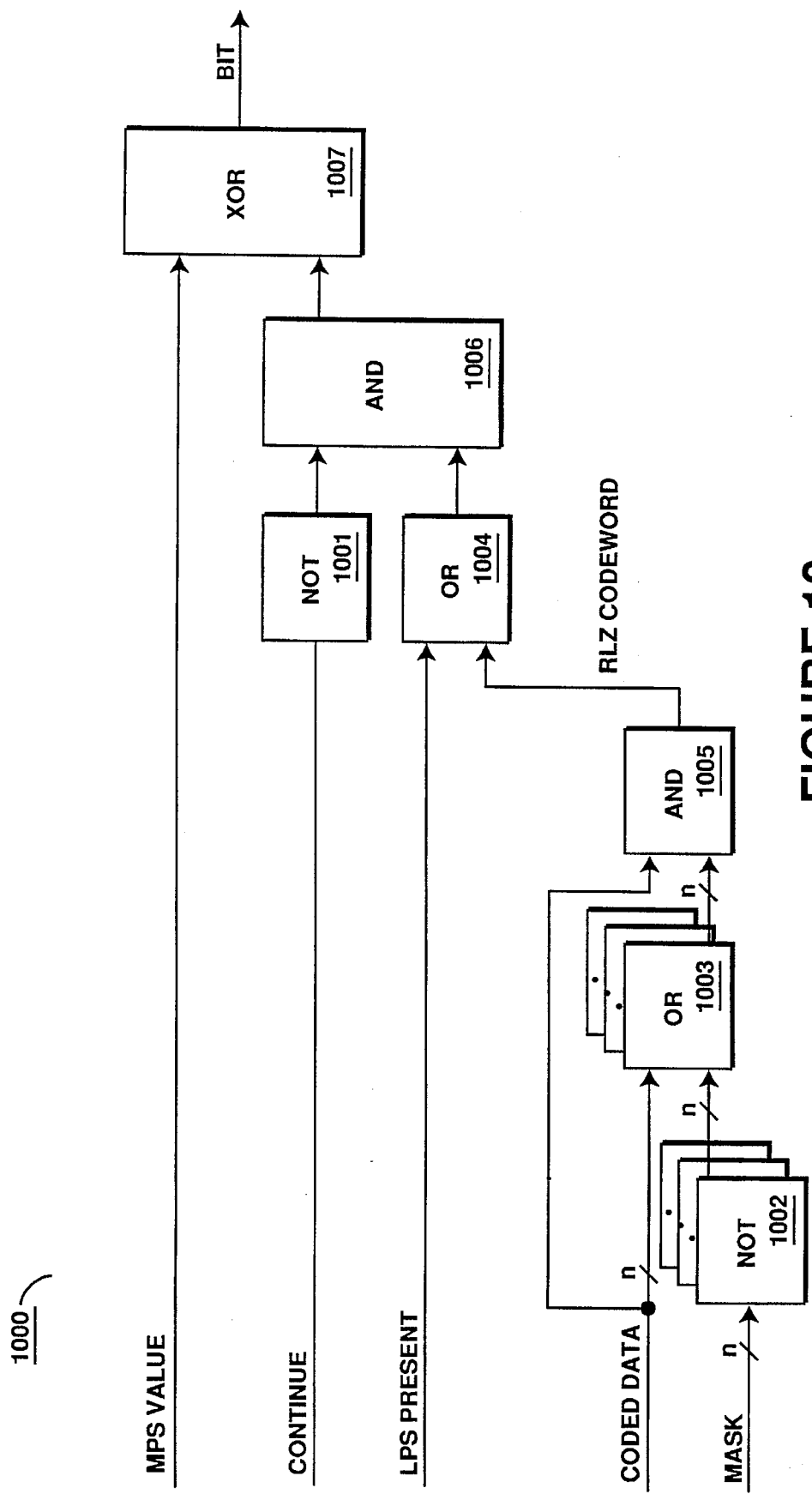
FIG. 10 is a block diagram of one embodiment of the bit generation circuitry of the present invention.

In one embodiment of bit generation circuitry for implementing the truth table in Table 9 is depicted in FIG. 10. Referring to FIG. 10, bit generation circuit 1000 includes NOT gate logic 1001–1002, OR gate logic 1003–1004, AND gate logic 1005–1006 and XOR gate logic 1007. NOT gate logic 1002 is coupled to receive the RLZ mask information on its input. The output of NOT gate logic 1002 is coupled to one input of OR gate logic 1003. In one embodiment, the output of NOT gate logic 1002 comprises n bits, where n is an integer equal to the largest codeword size minus one. The other input OR gate logic 1003 is coupled to receive n-bits of coded data starting with the second bit. The output of OR gate logic 1003 is coupled to the inputs of AND gate logic 1005. The first bit of the codeword is also coupled to AND gate logic 1005. The output of AND gate logic 1005 is coupled to one input of OR gate logic 1004. A single bit of coded data is also coupled to one of the inputs to AND gate logic 1005. The other input of OR gate logic 1004 is coupled to receive the bit indication of whether the LPS is present. The output of OR gate 1004 is coupled to one input of AND gate logic 1006. The other input to AND gate logic 1006 is coupled to the output of NOT gate logic 1001. The input to NOT gate logic 1001 is coupled to the continue bit. The output of AND gate logic 1006 is coupled to one input of XOR gate logic 1007. The other input to XOR gate logic 1007 is coupled to receive the current MPS value. The output of the XOR gate logic 1007 represents the bit that is generated during the third stage of the pipeline.

NOT gate logic 1001, OR gate logic 1004, AND gate logic 1006 and XOR gate logic 1007 implement the truth table depicted in Table 9. NOT gate logic 1002, OR gate logic 1003 and AND gate logic 1005 determine if an RLZ codeword is present. When the continue bit is a logical 1 (e.g., true), then the input to AND gate logic 1006 is logical 0, such that one of the inputs to XOR gate logic 1007 is a logical 0. In this case, the MPS is output from circuitry 1000 regardless of its value. On the other hand, if the continue bit is a logical 0 (e.g., false), the output of AND gate logic 1006 depends on the output from OR gate logic 1004. In this case, if the LPS present indication is a logical 1 (e.g., true), indicating that there is an LPS at the end of the run, then the output of OR gate logic 1004 is a logical 1, such that AND gate logic 1006 outputs a logical 1 to XOR gate logic 1007. In this case, the bit generated by XOR logic 1007 comprises the opposite of the MPS, or the LPS.

If the continue bit is a logical 0 and the LPS present indication is a logical 0, then the output of XOR gate logic 1007 is based on the RLZ codeword indication signal. When bit generation circuitry 1000 receives a set of inputs, NOT gate logic 1002 and OR gate logic 1003 generate all "1" bits if a RLZ codeword is present. AND gate logic 1005 detects if all of the bits output from OR gate logic 1003 are "1"s, and if so, asserts the "RLZ codeword" signal. When the RLZ codeword signal is asserted, the output of OR gate logic 1004 outputs a logical 1. If the continue bit is a logical 0 (e.g., not true), then the output of AND gate logic 1006 is a logical 1. When the output of AND gate logic 1006 is a logical 1, the LPS is output. However, if AND gate logic 1005 does not detect all of the bits output from OR gate logic 1003 as being "1"s, then the RLZ codeword signal is a logical 0, such that any output of OR gate logic 1004 is low and the output of AND gate logic 1006 is low. In this case, the output of XOR gate logic 1007 is the MPS.

In one embodiment, the coded data inputs are stable before the other inputs are latched from an external memory read. The width of the coded data bus for transferring the coded data is the size of the longest RLZ codeword. In one embodiment, the data bus size is 13 bits wide. In this case, NOT gate logic 1003 and OR gate logic 1003 generate 13 "1" bits if a RLZ codeword is present. The OR gate logic 1003 generates the 13 "1" bits using thirteen 2-bit OR gates. AND gate logic 1005 receives all of the outputs from OR gate logic 1003 and detects if all 13 bits of its input are "1".

AND gate logic 1005 detects the outputs from OR gate logic 1003 using a 13 input AND gate. If all 13 bits are "1", then AND gate logic 1005 asserts the "RLZ codeword" signal. Since the first bit of all RLZ codewords is always a "1", one RLZ mask bit with its associated NOT and OR gates can be eliminated.

Figure 11:
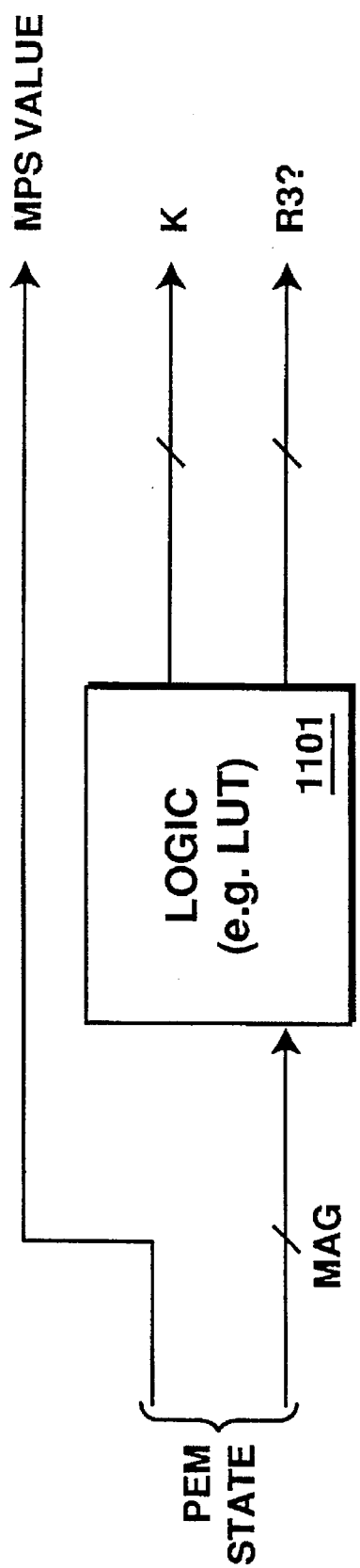
FIG. 11 illustrates logic for decoding the PEM state in the present invention.

During the third stage, the probability state is processed in parallel with the bit generation. In the present invention, the PEM converts the PEM state into a code. In one embodiment, this conversion is done with combinational logic. In processing the PEM state, the present invention determines the current code, as well as the mask for the code to evaluate the code stream. The PEM state is processed to obtain the k value and the R value of the R-code. In one embodiment, seven bits represent the PEM state and are converted into 4 bits representing the k value and one bit representing whether the code is an R3 code or not. FIG. 11 illustrates such conversion logic. Of the seven bits, six of the bits are received by the logic 1101 as the magnitude to generate the R3 and k values. The other bit is the sign bit used to identify the MPS value. If the R3 indication bit is in a first logic state (e.g., a logical 1), then the code is an R3 code. If the R3 indication bit is in a second logic state (e.g., a logical 0), then the code is an R2 code. Table 10 shows a truth table which describes the combinational logic in one embodiment of logic 1101.

TABLE 10

| | | State to code conversion truth table | | | |
|---|---|---|---|---|---|
| state | K | R3 | state | K | R3 |
| 0 | 0 | 0 | 18 | 3 | 1 |
| 1 | 0 | 0 | 19 | 4 | 0 |
| 2 | 0 | 0 | 20 | 4 | 1 |
| 3 | 0 | 0 | 21 | 5 | 0 |
| 4 | 0 | 0 | 22 | 5 | 1 |
| 5 | 0 | 0 | 23 | 6 | 0 |
| 6 | 1 | 0 | 24 | 6 | 1 |
| 7 | 1 | 0 | 25 | 7 | 0 |
| 8 | 1 | 0 | 26 | 7 | 1 |
| 9 | 1 | 0 | 27 | 8 | 0 |
| 10 | 1 | 0 | 28 | 8 | 1 |
| 11 | 1 | 0 | 29 | 9 | 0 |
| 12 | 1 | 1 | 30 | 9 | 1 |
| 13 | 1 | 1 | 31 | 10 | 0 |
| 14 | 1 | 1 | 32 | 10 | 1 |
| 15 | 2 | 0 | 33 | 11 | 0 |
| 16 | 2 | 1 | 34 | 11 | 1 |
| 17 | 3 | 0 | 35 | 12 | 0 |

In another embodiment, the R3 bit value, the state to code conversion may be performed ahead of time. The k value and the current table location (its instance) may then be stored in memory together and accessed during the PEM decoding.

Using the code, as represented by the R3 and k values, the present invention generates the maximum run-length, the mask and the R3 split value. In one embodiment, the generation of the maximum run length, the mask and the R3 split value is accompanied using logic implementing a truth table such as shown in Table 11. Referring to Table 11, the "x" indicates "don't cares".

TABLE 11

Truth Table For Converting Code To Information Needed For Decoding

| k[ ] | r3 | maxri[ ] | mask[ ] | r3split |
|---|---|---|---|---|
| 0 | 0 | 1 | 0 | x |
| 1 | 0 | 2 | 1 | x |
| 1 | 1 | 3 | 1 | 1 |
| 2 | 0 | 4 | 3 | x |
| 2 | 1 | 6 | 3 | 2 |
| 3 | 0 | 8 | 7 | x |
| 3 | 1 | 12 | 7 | 4 |
| 4 | 0 | 16 | 15 | x |
| 4 | 1 | 24 | 15 | 8 |
| 5 | 0 | 32 | 31 | x |
| 5 | 1 | 48 | 31 | 16 |
| 6 | 0 | 64 | 63 | x |
| 6 | 1 | 96 | 63 | 32 |
| 7 | 0 | 128 | 127 | x |
| 7 | 1 | 192 | 127 | 64 |
| 8 | 0 | 256 | 255 | x |
| 8 | 1 | 384 | 255 | 128 |
| 9 | 0 | 512 | 511 | x |
| 9 | 1 | 768 | 511 | 256 |
| 10 | 0 | 1024 | 1023 | x |
| 10 | 1 | 1536 | 1023 | 512 |
| 11 | 0 | 2048 | 2047 | x |
| 11 | 1 | 3072 | 2047 | 1024 |
| 12 | 0 | 4096 | 4095 | x |

In Table 11, the mask value is equal to $(2^k)-1$. This mask value is also used as the current RLZ mask. The R3 split value is equal to $2^{(k-1)}$ if the R3 indication indicates that an R3 code is to be used for decoding (e.g., the R3 indication is set to a logical 1). The maximum run-length has been described earlier.

Figure 12:
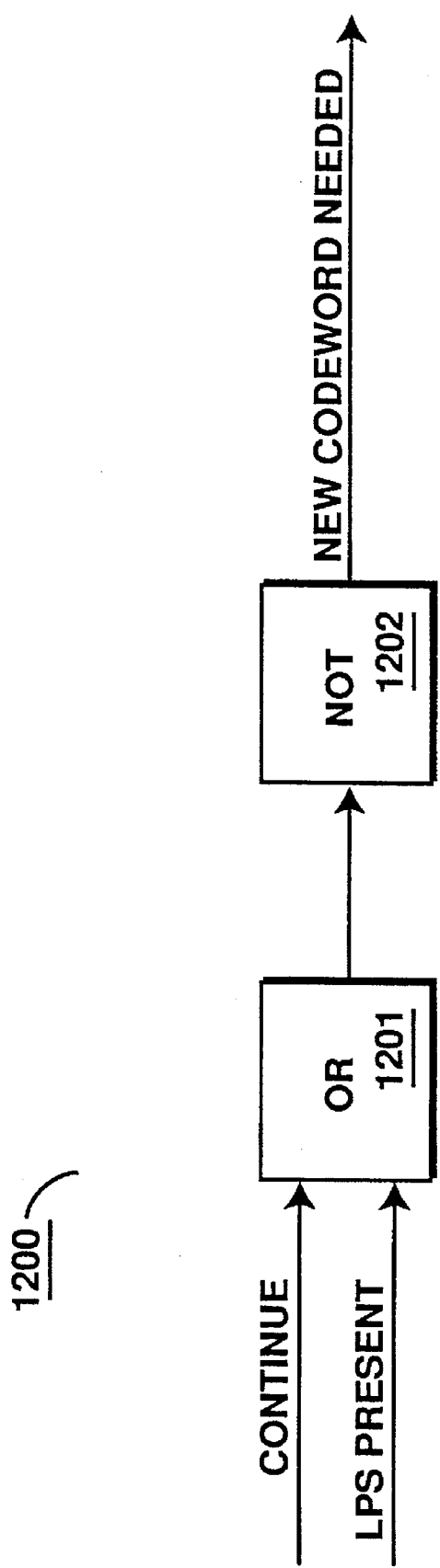
FIG. 12 is a block diagram of one embodiment of logic for determining if a new codeword is needed.

Also occurring in parallel in the third stage of the pipeline, the present invention determines whether a new codeword is needed. A new codeword is needed when the decoding process is not in the middle of a run. In other words, if the decoder is in the middle of a run, then a new codeword is not needed for the decoding process. In one embodiment, a determination of whether a new code is needed is made based on the continue bit and the LPS indication. If the continue bit is 0 and the LPS is 0, then a new codeword is generated. FIG. 12 is a block diagram of one embodiment of the logic for performing the new codeword determination. Referring to FIG. 12, circuitry 1200 includes OR gate logic 1201 and NOT gate logic 1202. OR gate logic 1201 is coupled to receive the continue bit and the LPS present indication. The output of OR gate logic 1201 is coupled to the input of NOT gate logic 1202, which outputs the new codeword needed indication if both the continue bit and the LPS present indication are a logical 0.

Also in the third stage, a new value of k is generated. In one embodiment, the new value of new-k is generated according to the truth table in Table 12 based on the first bit of coded data and the PEM state.

TABLE 12

Truth Table for new value of K

| PEM state | first bit of coded data | new K | PEM state | first bit of coded data | new K | PEM state | first bit of coded data | new K |
|---|---|---|---|---|---|---|---|---|
| 0 | 0 | 0 | 24 | 0 | 7 | 12 | 1 | 1 |
| 1 | 0 | 0 | 25 | 0 | 7 | 13 | 1 | 1 |
| 2 | 0 | 0 | 26 | 0 | 8 | 14 | 1 | 1 |
| 3 | 0 | 0 | 27 | 0 | 8 | 15 | 1 | 1 |
| 4 | 0 | 0 | 28 | 0 | 9 | 16 | 1 | 2 |
| 5 | 0 | 1 | 29 | 0 | 9 | 17 | 1 | 2 |
| 6 | 0 | 1 | 30 | 0 | 10 | 18 | 1 | 3 |
| 7 | 0 | 1 | 31 | 0 | 10 | 19 | 1 | 3 |
| 8 | 0 | 1 | 32 | 0 | 11 | 20 | 1 | 4 |
| 9 | 0 | 1 | 33 | 0 | 11 | 21 | 1 | 4 |
| 10 | 0 | 1 | 34 | 0 | 12 | 22 | 1 | 5 |
| 11 | 0 | 1 | 35 | 0 | 12 | 23 | 1 | 5 |
| 12 | 0 | 1 | 0 | 1 | 0 | 24 | 1 | 6 |
| 13 | 0 | 1 | 1 | 1 | 0 | 25 | 1 | 6 |
| 14 | 0 | 2 | 2 | 1 | 0 | 26 | 1 | 7 |
| 15 | 0 | 2 | 3 | 1 | 0 | 27 | 1 | 7 |
| 16 | 0 | 3 | 4 | 1 | 0 | 28 | 1 | 8 |
| 17 | 0 | 3 | 5 | 1 | 0 | 29 | 1 | 8 |
| 18 | 0 | 4 | 6 | 1 | 0 | 30 | 1 | 9 |
| 19 | 0 | 4 | 7 | 1 | 1 | 31 | 1 | 9 |
| 20 | 0 | 5 | 8 | 1 | 1 | 32 | 1 | 10 |
| 21 | 0 | 5 | 9 | 1 | 1 | 33 | 1 | 10 |
| 22 | 0 | 6 | 10 | 1 | 1 | 34 | 1 | 11 |
| 23 | 0 | 6 | 11 | 1 | 1 | 35 | 1 | 11 |

In the fourth stage, decoding a new codeword involves multiplexing either the maximum run length or a count masked out of the coded data stream. If R3 codes are used, there are three possible ways that a count can be stored in the coded data stream. Logic expands the code into the maximum run length and masking information. Counts of zero are also detected so that a RLZ codeword mask may be output instead of a run count. Updating the run count for the current codeword requires decrementing the count if the count is greater than one. Counts of zero are replaced with a RLZ codeword mask.

The current code, as indicated by the k and R3 values, is converted into a maximum run length, the mask for the "1" codewords and the value for R3 codes of the first long codeword, referred to herein as the R3 split value. The mask value indicates the number of valid bits in a codeword for a given code. Using this information, the present invention is able to decode a codeword.

The current codeword is decoded by first determining if there is an LPS at the end of the run. In one embodiment, this determination is accomplished by examining the first bit. If the first bit is a logical 1, then a LPS is at the end of the run. If this is the case, then the run count represented by the codeword is determined.

Figure 13:
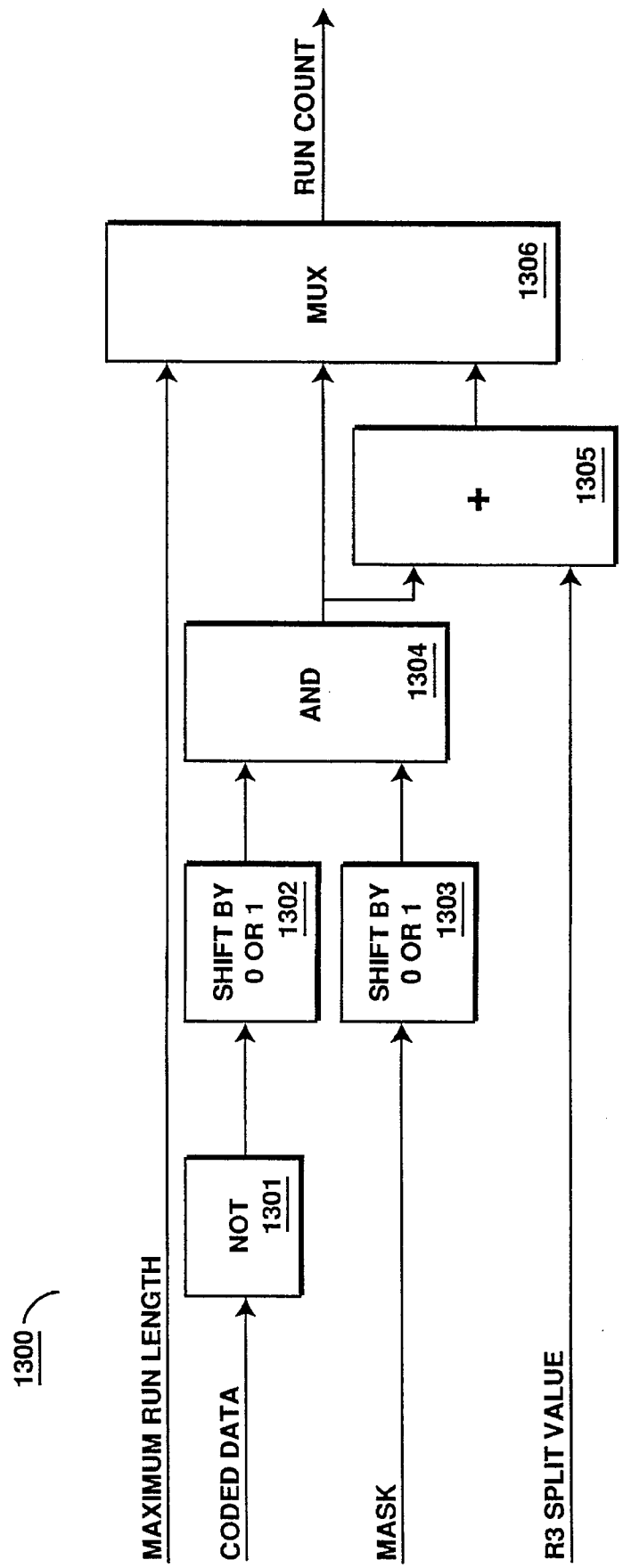
FIG. 13 is a block diagram of one embodiment of the decode logic of the present invention.

The determination of the run length indicated by a codeword is performed by the decode logic 1300 shown in FIG. 13. Referring to FIG. 13, decode logic 1300 includes NOT gate logic 1301, shift logic 1302–1303, AND gate logic 1304, adder logic 1305 and multiplexer (MUX) 1306. The maximum run length is coupled to be received by one input of MUX 1306. The other inputs of MUX 1306 are coupled to the output of adder logic 1305, and the output of AND gate logic 1304, and the next RLZ mask (generated by the code-to-mask logic in the third pipestage). The output of AND gate logic 1304 is also coupled as one of the inputs to adder logic 1305. The other input to adder logic 1304 is coupled to the R3 split value. The inputs to AND gate logic 1304 are coupled to shift logic 1302 and 1303. The input to shift logic 1303 is coupled to the mask for the code. The input to shift logic 1302 is coupled to the output of NOT gate logic 1301. The input to NOT gate logic 1301 is coupled to the coded data. Decode logic 1300 also includes logic 1310 for generating the indication of whether an LPS is present.

Given the current codeword, the run count is determined. For "0" codewords, the maximum run length is output as the run count. For R2 codewords, the coded data inverted by NOT gate logic 1301 is ANDed with mask value by AND gate logic 1304 to produce the run count (where shifter 1302 and 1303 do not shift the mask). For short R3 codewords (i.e., an R3 codeword with a first and the second bit are a logical 1), the run count is the result of the coded data being inverted by NOT gate logic 1301, shifted by 1 by shifter 1302 and ANDed using AND gate logic 1304 with the mask that is shifted by 1 by shifter 1303. Otherwise, for R3 long codeword if the first bit is a 1 and the next bit is a zero, then the coded data is inverted by NOT gate logic 1301, shifted by 1 by shifter 1302 and ANDed by AND gate logic 1304 with the mask and then added to the R3 split value by adder logic 1305. The R3 split value is the run count for the first long R3 codeword. In the present invention, the R3 split value is a power of 2. The operations of the decode logic of the present invention are summarized Table 13 below:

TABLE 13

| Decoder Operation | |
|---|---|
| Condition | Run Count OutPut |
| Codeword bit 0 is "0" | maximum run length |
| codeword bit 0 is "1" and code type is R2 | mask[11..0] AND (NOT codeword [12:1] |
| codeword bit 0 is "1", codeword bit 1 is "1" and code type is R3 | mask[11..1] AND (NOT codeword [12..2] |
| codeword bit 0 is "1", codeword bit 1 is "0" and code type is R3 | R3 split + (mask[10..0] AND (NOT codeword [12..2])) |

If the run count is zero, then the mask value for detecting a following RLZ codeword is output, instead of the run count. The LPS present bit output by the decoder is simply codeword bit zero. This is shown as logic 1310, which may include a pipeline delay so that its generation coincides with generation of the run count.

Figure 14:
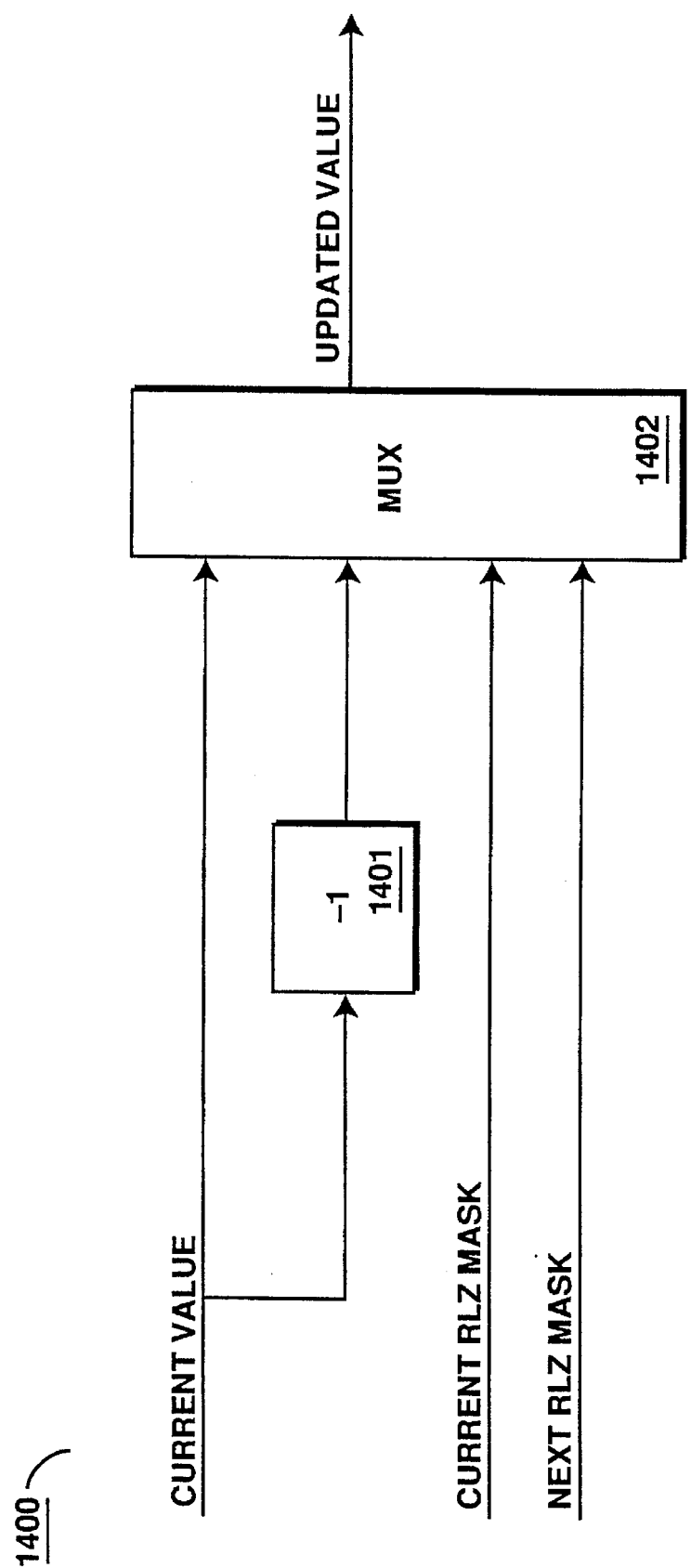
FIG. 14 is a block diagram of one embodiment of logic for updating the run count.

In the next operation to be performed, a new run count is generated. FIG. 14 is a block diagram of one embodiment of logic for updating the next run count. Referring to FIG. 14, update logic 1400 includes subtractor logic 1401 and multiplexer (MUX) 1402. Subtractor logic 1401 is coupled to receive the current value and outputs a value one less than the current value. MUX 1402 is coupled to receive the current value, the output of subtractor logic 1401, the current RLZ mask and the next RLZ mask. The output of MUX 1402 is the updated value, or the next run count.

In the present invention, the default case is for the updated run count to be one less than the current run count. In this case, MUX 1402 outputs the value received from subtractor logic 1401. Run counts of zero are replaced with RLZ codeword masks. The RLZ codeword masks are passed through without modification when an LPS is output. This operation is summarized in Table 14 below:

TABLE 14

| Run Count Update Logic | | |
|---|---|---|
| Condition | Updated Value Output | Next Value For Continue bit |
| current value input is a run count greater than 1 (and the continue bit is "1" | run count - 1 | 1 |

TABLE 14-continued

| Run Count Update Logic | | |
|---|---|---|
| Condition | Updated Value Output | Next Value For Continue bit |
| current value input is a run count equal to 1 (and the continue bit is "1") and the new codeword decoded | next RLZ mask | 0 |
| current value input is a run count equal to 1 (and the continue bit is "1") and the new codeword is not decoded | current RLZ mask | 0 |
| continue bit is "0" | current value (which is a RLZ mask) | 0 |

Also occurring in parallel in the fourth stage, the PEM states are updated. Updating the PEM state involves incrementing or decrementing the state based on the first bit of the codeword. The MPS is switched instead of decrementing when the current state is zero. In one embodiment, the state must not exceed a maximum value.

In the present invention, the MPS is changed if a "1" codeword is encountered when in state 0; otherwise, a "1" codeword causes the state to be decremented. The "0" codewords cause the state to be incremented until the maximum state is reached.

A truth table depicting the PEM state update is shown in Table 15 below:

TABLE 15

| PEM State Update Truth Table | | | |
|---|---|---|---|
| Present State | Codeword Bit 0 | Next State | Switch MPS? |
| 0 | 1 | 0 | 1 |
| maximum state | 0 | maximum state | 0 |
| 1 through maximum state - 1 | 0 | present state +1 | 0 |
| 1 through maximum state - 1 | 1 | present state -1 | 0 |

In one embodiment, the updated PEM states are multiplexed with the current PEM states so that updates only occur when a new codeword is decoded.

Also occurring in parallel in fourth stage, the next RLZ codeword (for the new PEM state) is determined using the same logic that is used to convert the PEM state into a code and expand it into a mask, using Table 11 and is generated based on the new-k generated using Table 12. In other embodiments, the output of the PEM state update logic (Table 15) can be coupled to the input of state to code conversion logic (additional logic identical to logic 1101) to generate the new value of K.

Once the fourth stage has been completed, the new bit generator state and PEM state is written to memory. Note that the count, continue bit, LPS value, and MPS value can all change. Also in the fifth stage, the coded data stream is shifted to the next codeword. The shifting operation is completed in the sixth stage.

Figure 15:
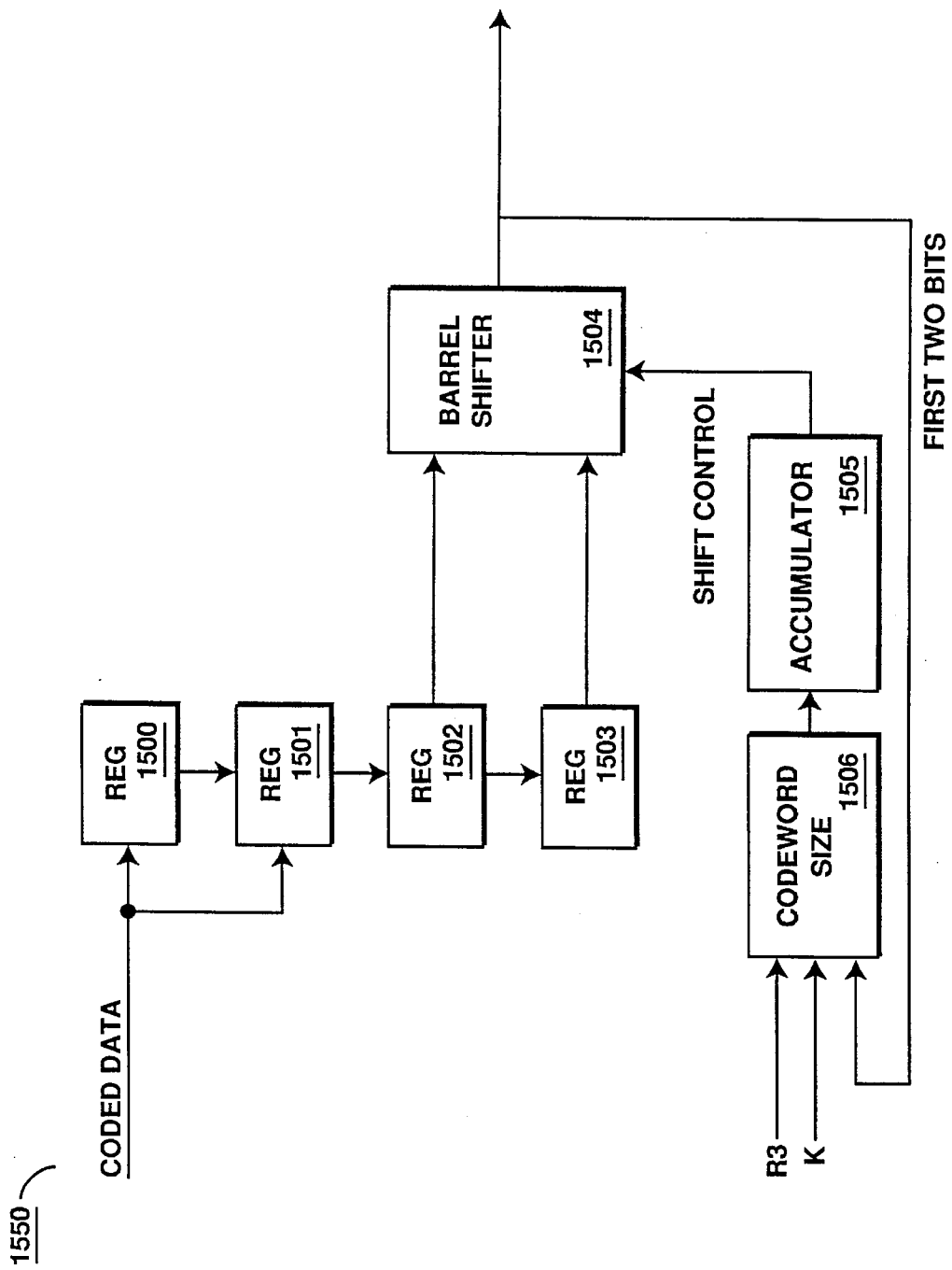
FIG. 15 is a block diagram of one embodiment for shifting coded data into the decoder of the present invention.

One embodiment of the shifter of the present invention is shown in FIG. 15. Referring to FIG. 15, the shifter 1550 includes registers 1500–1503, barrel shifter 1504, accumulator 1505 and codeword size unit 1506. Registers 1500 and 1501 are coupled to receive the coded data. Register 1500 is also coupled to register 1501. Register 1501 is coupled to register 1502. Register 1502 is coupled to register 1503 and barrel shifter 1504. Register 1503 is also coupled to barrel shifter 1504. Accumulator 1505 is also coupled to barrel shifter 1504. The codeword size unit 1506 is coupled to receive the R3 indication, the k value and a feedback from barrel shifter 1504 and outputs a signal that is coupled to accumulator 1505. In the preferred embodiment, registers 1501–1503 are 16-bit registers, barrel shifter 1504 is a 32-bit to 13-bit barrel shifter and accumulator 1505 is a 4-bit accumulator.

Registers 1500–1501 accept 32-bit words from the FIFO and registers 1502–1503 provide 32-bits of input to barrel shifter 1504. At least 32 bits of the undecoded data is provided to barrel shifter 1504 at all times. The four registers 1500–1503 are initialized with two 32-bit words of coded data to begin. The codeword size unit 1506 determines if a "1" codeword is present and, if so, how many bits after the "1" are part of the current codeword. In one embodiment, the codeword size unit 1506 operates as shown in Table 16 below:

TABLE 16

| Codeword Size Block Logic | | | |
|---|---|---|---|
| Codeword Bit 0 | Codeword Bit 1 | R3? | Output |
| 0 | x | x | 1 |
| 1 | 1 | x | k + 1 |
| 1 | x | 0 | k + 1 |
| 1 | 0 | 1 | k + 2 |

Note that k is the run length parameter that describes the code, i.e. R2(k) or R3(k), and "x" indicates "do not care" values.

Accumulator 1505 is a four bit accumulator used to control barrel shifter 1504. Accumulator 1505 increases its value by the value input from the codeword size unit 1506. When accumulator 1505 overflows (e.g., every time the shift count is 16 or greater), registers 1501–1503 are clocked to shift. Every other 16 bit shift causes a new 32 bit word to be requested from the FIFO. The input to accumulator 1505 is the size of the codeword, which is determined by the current code and the first one or two bits of the current codeword. Note that is some embodiments, registers 1501–1504 must be initialized with coded data before the decoding can begin.

Note that the pipelined decoder of the present invention does not predecode run counts for each context bin before starting the context model. Because of this, the state information stored in memory includes an invalid-run-count state. A new codeword is decoded to determine the next bit when an invalid-run-count state occurs for a context bin. If external memory is zeroed during initialization, a state of all zeros should indicate that a new codeword must be decoded. Therefore, a run count for every context bin does not have to be predecoded before starting bit generation. If context bins required predecoding, all context bins would need to have at least one codeword whether they were used or not. Since it is common to have context bins that are unused for a given data, this would influence compression efficiency. Even if the compression reduction was not significant, predecoding complicates non-real-time software encoder and makes a real-time hardware encoder extremely difficult to implement.

On-Chip Memory

On-chip memory may be used to store the state information for each context bin. On-chip memory allows for a higher speed operation and reduces input/output (I/O) count (which reduces package costs). In one embodiment, on-chip memory only stores enough state information for smaller bit generators and uses external memory for the additional state information, if desired. Multiple banks of memory may be used to reduce the I/O required by using internal memory for some banks and external memory for others. The on-chip memory might be used as a cache to store information from commonly used contexts. Information may then be forwarded for use by the decoding system, instead of having access to the information from external memory. In some embodiments, on-chip memory may only be use to store the least significant portion of larger run counts, and would access external memory only at the end of a run or when counting down required accessing a more significant bit.

Context Bin Reuse Delay Reduction

The context bin reuse delay is a combination of two effects. After the context model determines the current context bin, delay is required after using a given context bin before it can be used again. Another delay is required after using one context bin in a group of context bins before another member in the same group can be used again.

One delay is due to the use of multiple banks of memory to increase bandwidth. For example, by using two banks of RAM, the context bins are divided into two sets, a first set that uses a first bank of RAM and a second set that uses a second bank of RAM. Accesses to the banks, and therefore, the use of two sets of context bins, alternate. While one of the banks is being read for context information, the other is being written into. This means that the context revisit delay is an even number of clock cycles. The second effect is that before the RAM for a given context bin can be read, sufficient time must have been passed since it has last been used to compute the correct state information (updated PEM state and bit generator state), write to RAM and to shift to the next codeword. This requires all of the operations from the second state of the pipeline through the sixth stage to be completed.

There are certain solutions to reduce the context bin revisit delay. In the present invention, the context bin revisit delay can be reduced based on the notion that the context model can indicate to the decoder once successive uses of the same context bin occurs. When this occurs, the context bin data that is to be written may be forwarded for subsequent use. That is, instead of the data being written and then read from memory, the data could be forwarded directly for use. In this case, the extra write and read operations to memory may be avoided. In another embodiment, when successive uses of the same context bin occur, a special context bin could be used. This would reduce compression in some instances. However, if successive uses of the same context occur infrequently enough, the reduced compression would not occur to impede performance. These special context bin might be a "no-code" context bin requiring no additional RAM. In another embodiment, the original context bin might be split into "normal" and "special" context bins A single context bin might be used as the "special bin" for may normal context bins. The context bin revisit delay may also be reduced by accelerating the processing of the second and subsequent requests in the decoder. In other words, the time to process two bits in the same context bin consecutively could be less than the time to process to independently. For example, operations like state to code conversion are easier.

PEM and Context Model Implementation

The PEM used in the present invention utilizes the same adaptation scheme regardless of the amount of data available. In another embodiment, a Bayesian approach to adapt more quickly initially, and to adapt more slowly as more data is available, may be used for a more accurate estimate. Furthermore, the PEM may be fixed in an field programmable gate array (FPGA) or a programmable PEM state tables/machine.

Context models are application dependent. Therefore, in one embodiment, an external context model is used. Programmable context models may also be used.

One Embodiment of the Decoding System

Figure 16A:
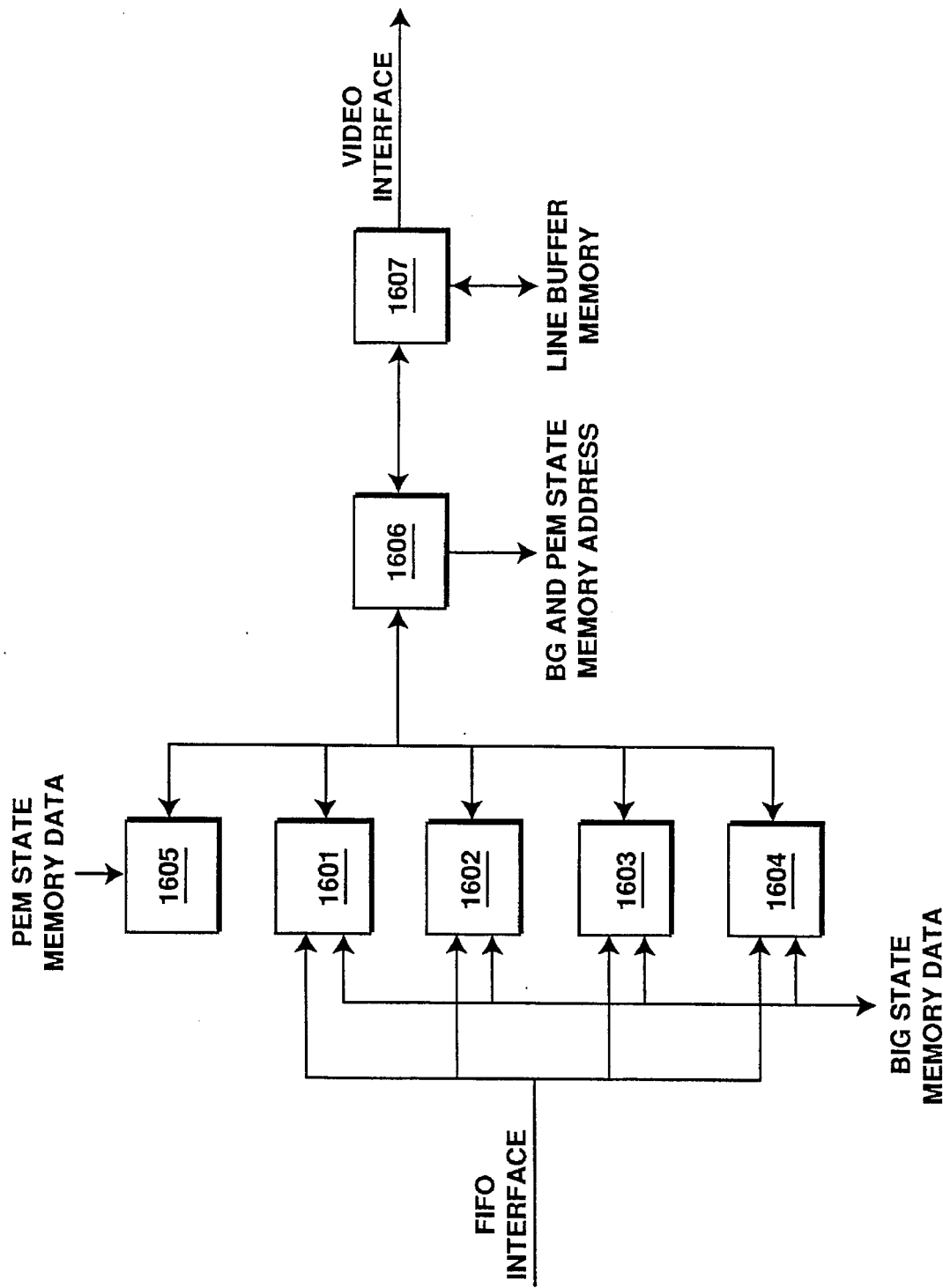
FIG. 16A illustrates one implementation of the decoding system of the present invention.

FIG. 16A is a block diagram of one implementation of the decoding system of the present invention. Referring to FIG. 16A, blocks 1601–1607 are field programmable gate arrays (FPGAs). Blocks 1601–1604 comprise bit generators with shifting capability and are coupled to receive coded data from the FIFO interface and count information (e.g., bit generator state) from memory. Bit generator blocks 1601–1604 are also coupled to block 1605 to receive PEM state from memory (via block 1605), such that the block 1605 implements the PEM. Bit generator blocks 1601–1604 are also coupled to block 1606 and producing a count and PEM memory address. Block 1606 is also coupled to block 1607. Block 1607 provides an output to interface circuitry, such as a video interface, and may be coupled to line buffer memory. Blocks 1606 and 1607 implement the context model of the present invention, as well as the interface. Thus, as shown in FIG. 16A, four bit generators (blocks 1601–1604) share a single input stream provided from a FIFO to process a coded data stream, while the PEM (block 1605) processes the PEM state for each of the four bit generators.

The four bit generators shown operate together as a synchronous resource pipeline. FIG. 17 illustrates how the four bit generators (e.g., blocks 1701–1704) operate with the context model (e.g., blocks 1706 and 1707) and the probability estimation module (e.g., block 1705). To highlight the structure of the pipeline, operations for the first bit are shaded. Note that the bit generator resources have idle times when the information required to perform the next operation is not available. Note that the bit generators operate in parallel, with staggered starting times so that each of the third, fourth, fifth and sixth stages of the pipeline are being performed by one of the bit generators at any one time. In other words, one of the 3–6 stages is being performed every cycle.

By using a staggered arrangement of bit generators, the present invention is not limited by the feedback loop that exists between the sixth stage and the third stage. Each bit generator completes the shifting to the next codeword in the sixth stage before bit generation can begin again in the third stage. For a single bit generator, when the resources of any one of the third, fourth, fifth or sixth stages are being used, the resources of the other stages do not have the proper information to allow them to operate. Thus, the staggering of bit generators allows each of the four stages to occur in parallel.

The third and fourth stages are referred to as the codeword processing of the bit generator, while the fifth and sixth stages are referred to as the shifting portion of the bit generator. In one embodiment, the present invention uses time multiplexing of the codeword processing and shifting is used to create two bit generators from one codeword processing portion and one shift portion. In other words, the hardware for one bit generator acts as two virtual bit generators. In such a configuration, two bit generators and two shifters could be used in a time multiplexed manner to provide the same decoding as the four bit generators in FIG. 16A. In this case, the data still must be in the proper order to that the correct data is supplied to each of the two virtual bit generators.

Figure 16B:
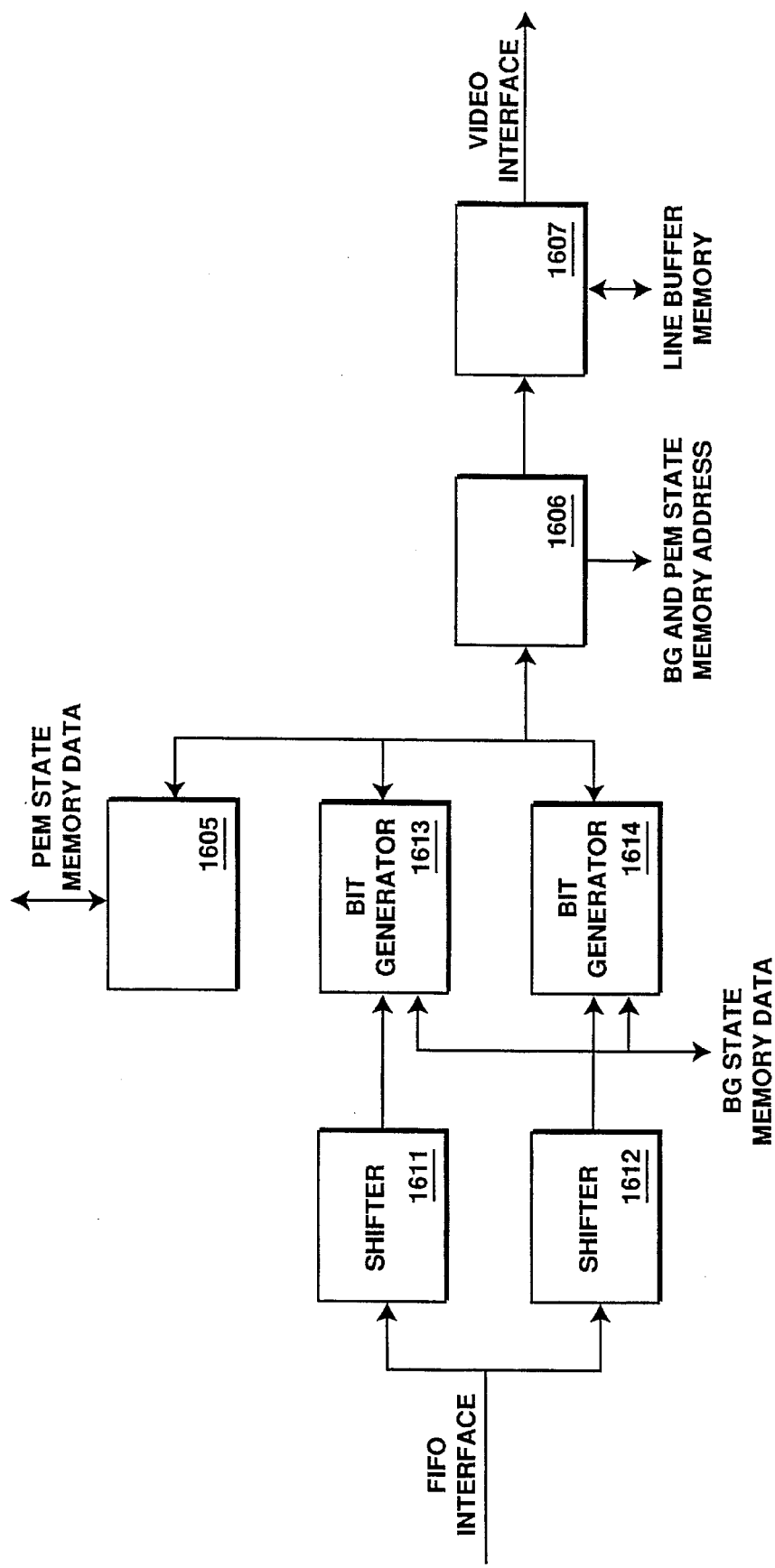
FIG. 16B illustrates another implementation of the decoding system of the present invention.

FIG. 16B is a block diagram of one embodiment of such a system. Referring to FIG. 16B, a FIFO interface is coupled to shifters 1611 and 1612. Shifters 1611 and 1612 are also coupled to BGs 1613 and 1614 respectively. BGs 1613 and 1614 are also coupled to the PEM memory via block 1605, the context model implemented with blocks 1606 and 1607 and the count memory in the same manner as in FIG. 16B. Note that in this embodiment, BGs 1613 and 1614 do not have to shift.

Limited-memory Real-time Encoding

A significant amount of buffering is needed for encoding. Consider why a system might need buffering. The data order into the encoder is the same as out of the decoder. However, the codeword order might be quite different because of the fractional bit characteristic of many entropy coders. Any one of the multiple encoders may encode several bits before emitting a codeword. Because of the parallelism, the bits directed to any given encoder could be separated by many bits in the original stream. These intervening bits are directed to other encoders and may create several, perhaps hundreds or thousands of codewords. The decoder, however, needs the codeword for the first bit first. Thus, reordering the codewords is essential for this scheme. One method of interleaving these codewords is presented.

The interleaving of several code streams places the complexity of the system on the encoder. The individual code streams are buffered while the codewords are interleaved into the data stream. A large amount of storage may be required, especially if the data for one context bin is far more skewed than for others, or is rarely called. In these two cases, the first bit to be coded in the codeword is many bits away from the last and several, maybe hundreds or thousands, other codewords are created by the intervening data. These codewords must be stored.

For an unbalanced system, where the encoding is done in non-real-time on a computer (with lots of memory and/or virtual memory), this is not a problem. However, this memory is a significant cost in a real-time VLSI implementation. To encode with limited memory, it is necessary to have some signaling between the encoder and decoder, either explicit, in stream, or implicit, when the memory limit has been reached and a graceful way to losslessly recover. These methods do have varying impact on coding efficiency, Note that implicit and explicit signalling may be implemented by circuitry external to the decoder, perhaps as part of the encoder, if the decoder has an input that forces a new codeword to be decoded. This input combined with the sufficient status output to synchronize the external circuitry to the decoder allows a "hook" to enable real-time decoding in the future.

Instream Signalling

In an example of instream signaling the R2(k) and the R3(k) code definitions are changed to include non-maximum length runs of MPSs that are not followed by LPS. This is accomplished by adding non-maximum length runs of MPSs that are not followed by LPS. This is accomplished by adding one bit to the codeword that occurs with the lowest probability. Then, if needed, there are uniquely decodable prefixes for non-maximum length run counts. Table 17 shows a R2(2) code with this property. This system has a minor impact on coding efficiency when there is no buffer overflow and a more substantial impact when there is overflow.

TABLE 17

| uncoded data | codeword | uncoded data | codeword |
| --- | --- | --- | --- |
| 0000 | 0 | 000 | 111000 |
| 0001 | 100 | 00 | 111001 |
| 001 | 101 | 0 | 11101 |
| 01 | 110 | | |
| 1 | 1111 | | |

Implicit Signalling

One manner of encoding with limited memory comprises implicit signaling to model the buffers at the decoder. One method for this is to have the encoder work with finite reordering buffers. One buffer can be assigned to each parallel coder. When a codeword is started, space is reserved in the appropriate buffer for the final codeword and a time-stamp is kept with each codeword to determine the order the codewords should be placed on the channel. When the last space in a buffer is reserved for a new codeword, then some codewords are placed in the compressed bit stream whether or not they have been completely determined.

The partial codeword with the lowest time-stamp is completed by choosing a codeword which is short and correctly specifies the symbols received so far. For example, in a R-coder system, if it is necessary to prematurely complete a codeword for a series of 100 MPSs in a run code with 128 maximum run-length, then the codeword for 128 MPSs can be used, since this correctly specifies the first 100 symbols. When the codeword with the lowest time-stamp has been completed, it can be removed from the reordering buffer and added to the code stream. This may allow previously completed codewords to be placed in the code stream as well. If forcing the completion of one partial codeword results in the removal of a codeword from the full buffer then coding can continue. If one buffer is still full, then the codeword with the lowest time-stamp must again be completed and added to the code stream. This process continues until the buffer which was full is no longer full.

Figure 18:
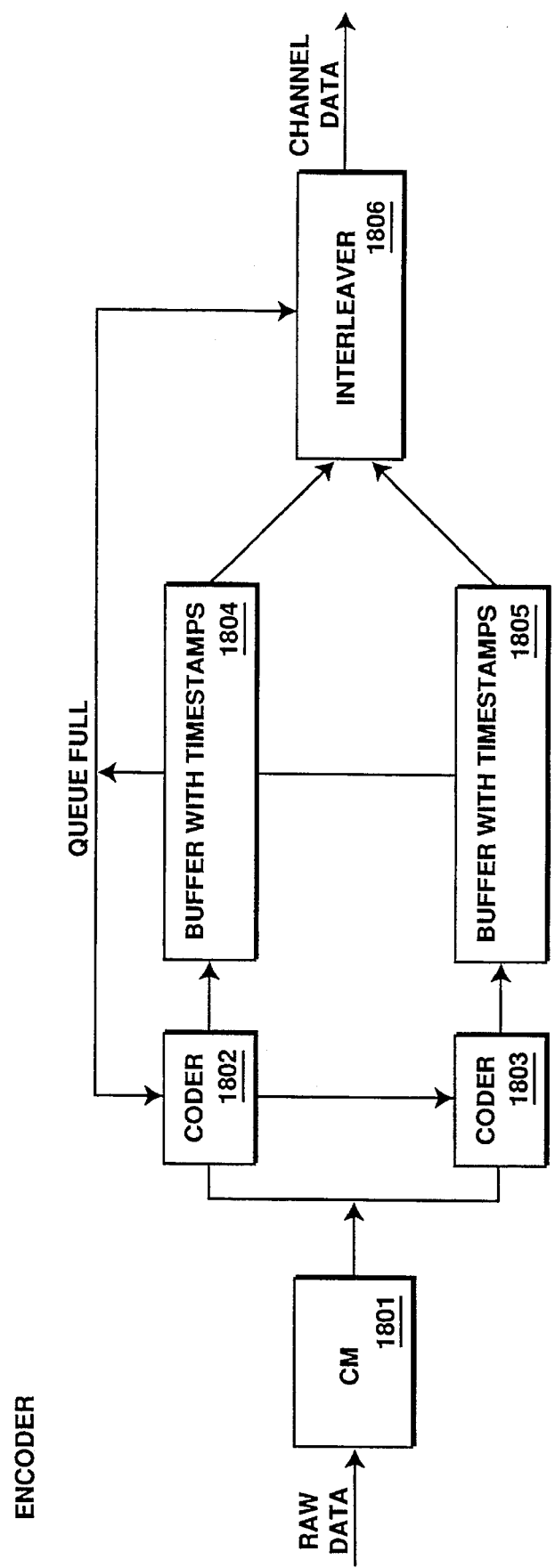
FIG. 18 is a block diagram of one embodiment of a limited-memory encoder with implicit signalling.

Such an encoder system is shown in FIG. 18. Referring to FIG. 18, context model (CM) 1801 is coupled to receive raw data and supply the data to codes 1802 and 1803. In one embodiment, CM 1801 sends data to coders 1802 and 1803 every other codeword. Coders 1802 and 1803 encode the data and send the data to be buffered in buffers 1804 and 1805 respectively. Each of buffers 1804 and 1805 include timestamps to indicate the temporal order of the data. Interleaver 1806 requests data from buffers 1804 and 1805 to create interleaved channel data. A queue full indication signal is provided by each of the buffers 1804 and 1805 to coders 1802 and 1803 and interleaver 1806 to indicate the state of buffers 1804 and 1805 as a mechanism for requesting when data is sent to each of the buffers 1804 and 1805 from its respective coder and when the data is forwarded as part of the interleaved data stream.

The decoder for this implicit signalling method keeps track of much of the same information as the encoder. The decoder maintains reordering buffers with time-stamps and partial code words. The decoder does not need this to decode under normal circumstances, but only to determine when the encoder completed a partial codeword because a buffer was full. When the decoder starts to decode a codeword, it places a time-stamp in the reorder queue. When the decoder completes decoding a particular codeword, it removes the time-stamp from the reordering queue. If one of the buffers fills then the partial codeword with the lowest time stamp must be removed from the buffer. Any additional outcomes which have not been used from that codeword are discarded because they do not correspond to real data. For example, the decoder might have received a codeword indicating 128 MPSs. After decoding 100 MPSs the decoder has a full time-stamp buffer and determines the codeword corresponding to 128 MPSs was prematurely completely by the encoder. The decoder ignores the remaining 28 MPSs that have been decoded, and uses a new codeword the next time that context occurs. Just like the encoder, the decoder continues to discard codewords until the buffer which was full is no longer full.

Figure 19:
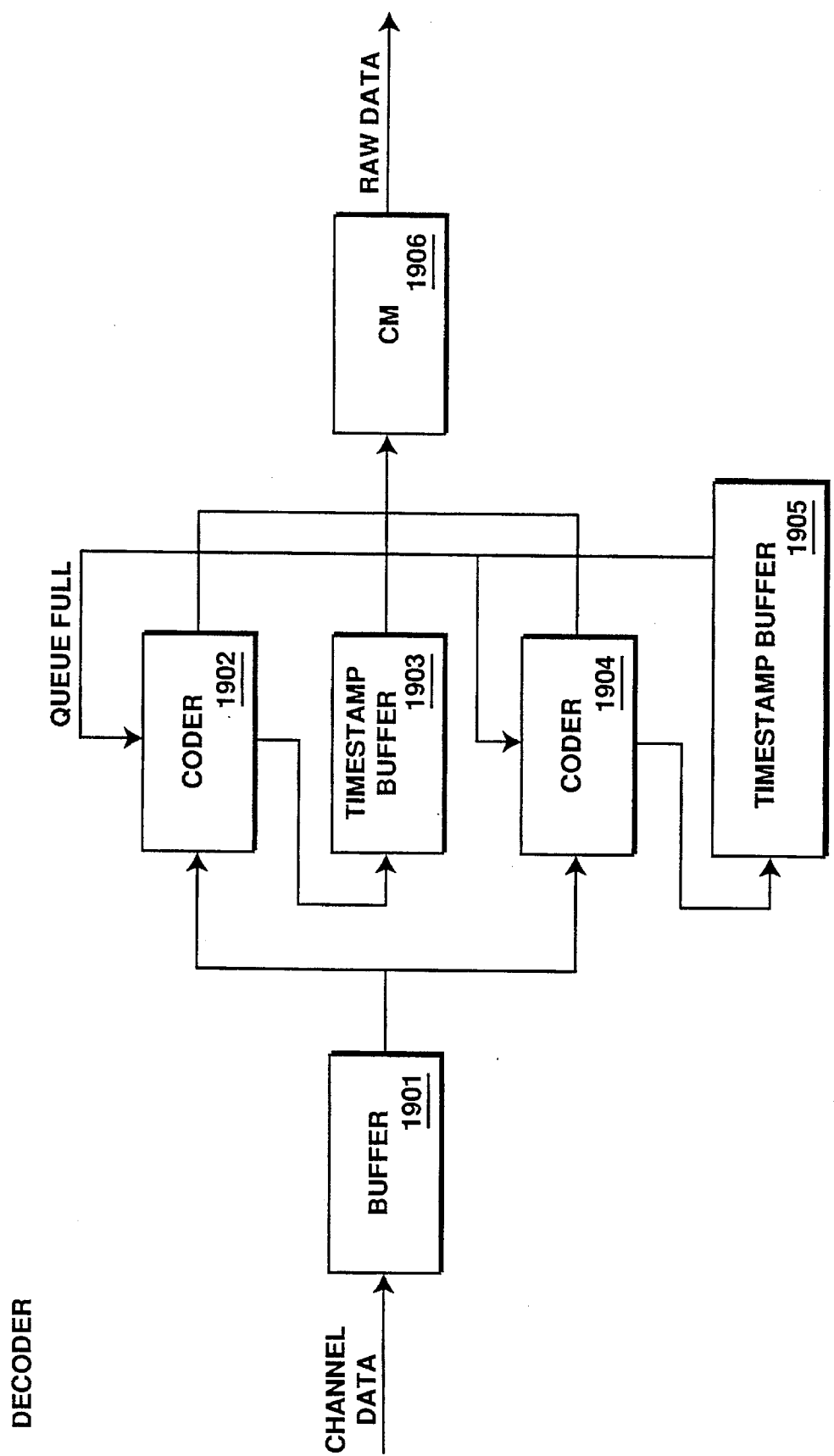
FIG. 19 is a block diagram of one embodiment of a decoder with a limited-memory for implicit signalling.

FIG. 19 illustrate a block diagram of one embodiment of a decoder system. Referring to FIG. 19, channel data is received by buffer 1901 which supplies the data to coders 1902 and 1904 for decoding. Coders 1902 and 1904 decode the data. The decoded data is requested by CM 1906 which outputs the data as the original raw data. Timestamp buffers 1903 and 1905 indicate the state of their coder. For instance, they indicate when the coder is full of data. When this is the case, a queue full indication is produced to the coder indicating that the coder is not to receive any more data for decoding at this time. When the condition no longer exists, the coder will be able to receive data for decoding again.

Explicit Signalling

An example of explicitly signalling is a separate "status" context bin that reports on the status of the buffers, This data is coded and sent to a separate decoder, possibly but not necessarily a dedicated decoder, in the code stream. This context bin is decoded once for every interleaved codeword. This says whether this was a regular (no buffer overflow) interleaved codeword or whether is was a "forced" (buffer overflow) interleaved codeword. The response to a "forced" is a matter of design. One possible response is to consider the one bit signal as equivalent to the prefix in the instream signalling case. When the overflow bit is active, then the 1n code is interpreted as a run of MPS values without an LPS value.

Snooper Decoder

As stated previously, the decoder(s) will have a deterministic order for requesting interleaved words from the data stream. It is necessary for the encoder unit to model this process to come up with the same order. (Note, with most variable-length codes, the order of generation at the encoders will be substantially different than the order of consumption at the decoders.) This model might be quite complex depending on the design of the decoder unit. One method for modeling this order is to replicate the decoder unit completely at the encoder unit. Thus, the design is assured of including all the memory and latency in any given design in the model at the encoder.

In the present invention, the encoders produce codewords from the independent streams. These codewords are bit packed into interleaved words. These interleaved words are requested on an as needed basis by the snooper decoder that is recreating the data stream. Every requested interleaved word is both given to the snooper decoder and placed on the channel (or in the channel buffer).

Figure 20:
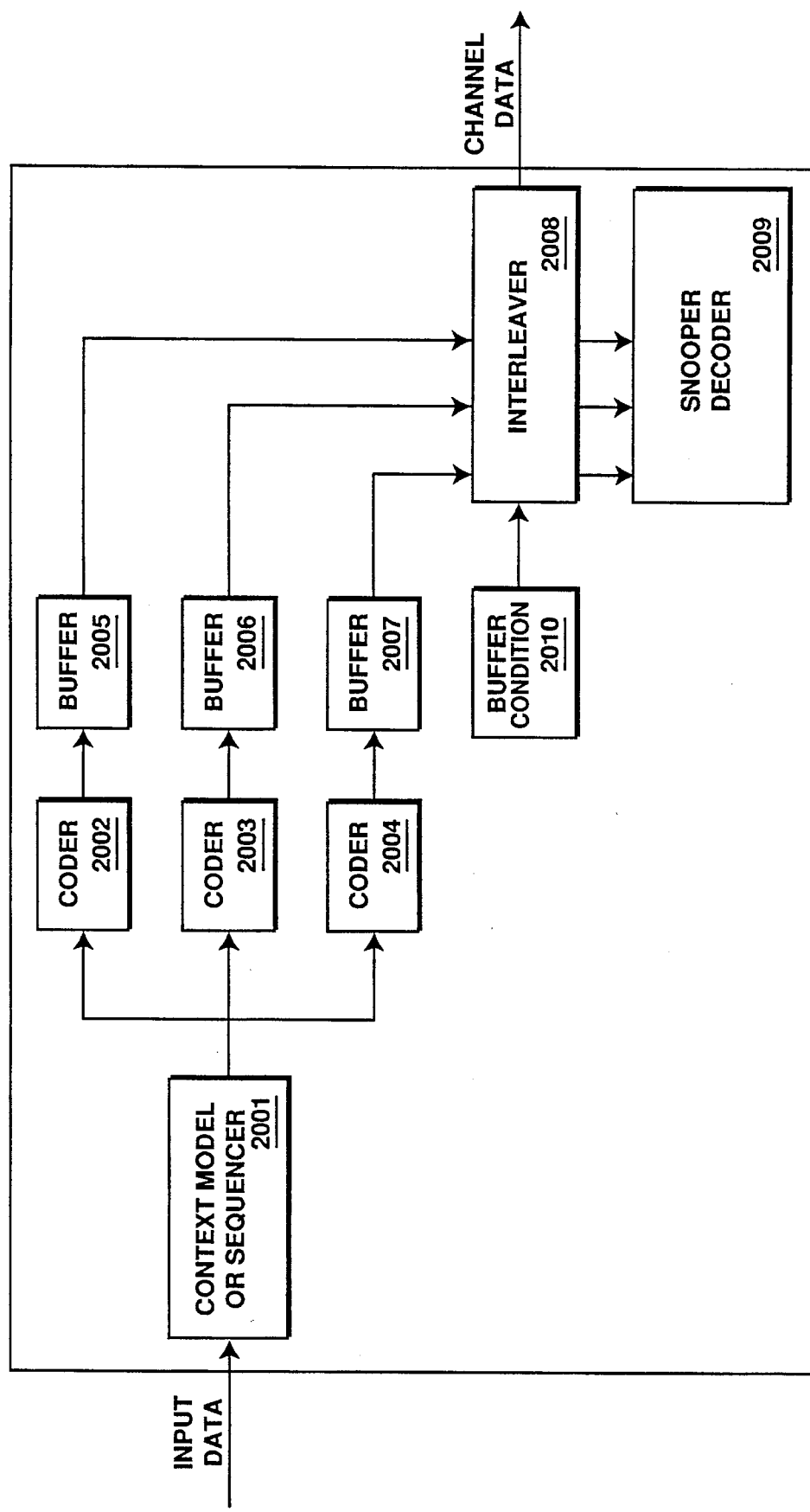
FIG. 20 is a block diagram of one embodiment of an encoder of the present invention.
Figure 21:
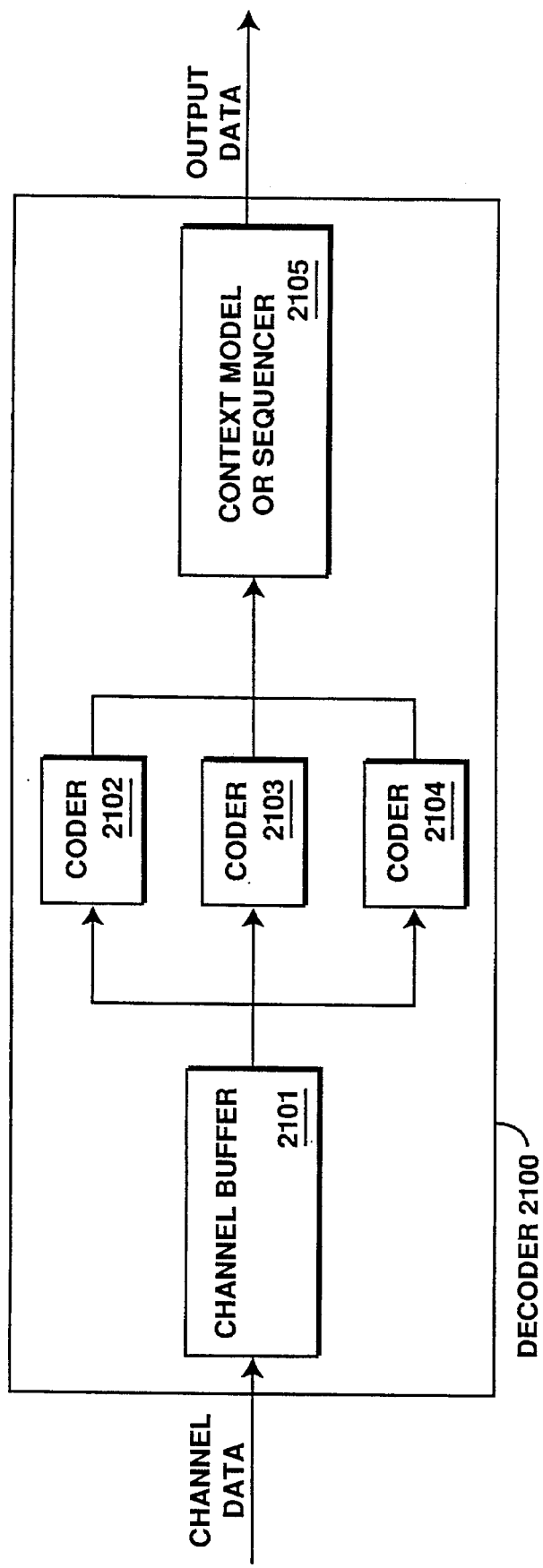
FIG. 21 is a block diagram of one embodiment of a decoder of the present invention.

Such a system is shown in FIG. 20. Referring to FIG. 20, input data is received by a sequencer 2001, such as a context model or state machine. Sequencer 2001 distributes the data to each of coders 2002–2004 in succession. Each of coders 2002–2004 encodes the data received and then stores it in buffers 2005–2007 respectively. Interleaver 2008 is coupled to receive data it requests from buffers 2005–2007. Interleaver 2008 requests and outputs the encoded data from buffers 2005–2007 according to the order call for by snooper decoder 2009. Buffer condition logic 2010 is coupled to interleaver 2008 and indicates the state of the buffers 2005–2007 as a way of informing interleaver 2008 for implicit or explicit signalling to the decoder. Note that the system may include more or less than three encoders. The codewords are delivered to the decoders on demand and the tokens are decoded in the same sequential order in which they were encoded. A decoder system is shown in FIG. 21. Referring to FIG. 21, coded channel data is received by channel buffer 2101. Channel buffer 2101 supplies the data to coders 2102–2104 in order to decode the data. The decoded results are sent to a sequencer 2105, such as a context model or state machine, which outputs the data.

Nonbinary Codes

This invention can be used for non-binary codes, for example Tunstall and Huffman.

Tunstall Codes

The parallel encoding and decoding of the present invention may employ non-binary codes, such as Tunstall codes. The Tunstall codes are variable length to fixed length codes. In other words, Tunstall codes receive a variable length input and produce a fixed sized output during encoding. Therefore, the coded data stream that results comprise codewords of the same size.

One embodiment of a Tunstall code is shown in Table 18. It should be noted that the code shown in Table 18 is equivalent to the uncoded data or the R2(0) code, except that the code is used with a size 3 block.

TABLE 18

| Size 3 Binary Tunstall Code For 0.5 MPS Probability | |
|---|---|
| Input | output |
| mmm | 111 |
| mml | 110 |
| mlm | 101 |
| mll | 100 |
| lmm | 011 |
| lml | 010 |
| llm | 001 |
| lll | 000 |

Referring to Table 18, the "m" indicates the MPS and "l" indicates the LPS.

Another example of a Tunstall code is shown in Table 21.

TABLE 19

| Size 3 Binary Tunstall Code For 0.6 MPS Probability | |
|---|---|
| Input | Output |
| mmmm | 111 |
| mmml | 110 |
| mml | 101 |
| mlm | 100 |
| mll | 011 |
| lmm | 010 |
| lml | 001 |
| ll | 000 |

It should be noted that this code is good for probabilities near 0.60, and in particular, performs better than either the R2(0) code or the R2(1) code for probabilities between 0.57 and 0.66. Thus, even with a small output size, Tunstall codes perform better than R-codes in the gap between the first two R-codes. Larger output Tunstall codes do come arbitrarily close to the entropy limit eventually.

In the present invention, the output size may be fixed at any bit length. Because of the fixed length output, all data ordering operations only have to operate on codewords of this size. For instance, the output size may be 8 or 12 bits. The 8-bit codewords are especially useful for software operations.

Because the codewords are a fixed size, only simple shifting is required to be performed by each of the decoding blocks. The shifting logic is able to shift the same number of bit positions each time regardless of the codeword in the stream since each of the codewords are the same size. Therefore, by using Tunstall codes in conjunction with the present invention, the shifting hardware and functionality required during decoding is made simpler.

JPEG Still Image Compression Baseline Huffman Coding and Decoding

Another system example is a modification of the JPEG Huffman coding. (Note that this system is also appropriate for MPEG Huffman coding.) In this case, the selection of hardware resources (i.e., dividing the input data stream) is performed with a sequencer state machine. The uncoded tokens are delivered to adjacent coders in order. For example, if there are three coders then each coder receives every third token. Since the codewords are variable-length, concatenating into fixed-length words and reordering for channel interleaving is performed as before. Such a system is shown in FIG. 20.

The speedup of this system is directly proportional to the number of coders. The above system would be nearly three times faster than a single coder. Thus, for a single decoder that decodes at 20 million tokens per second, the three decoder system would run at 60 million tokens per second. In another example, five 20 m tokens/sec decoders would run at 100 m tokens/sec. Note that this is around the worst case token rate for High Definition Television.

This system also has the advantage that the buffering needed by the encoder is low and deterministic (not data dependent). Because Huffman coding creates a codeword for every token and the tokens are delivered equally between the coders, the worst case buffer length can be determined.

Consider that the Huffman code has a minimum codeword length, m, a maximum codeword length, L, and an interleaved word size, w. Since each coder emits at least the minimum m bits and at most the maximum l bits every n data tokens, where n is the number of coders, the worst case occurs when one coder has all minimum codewords and another has all maximum codewords. The number of tokens before a complete interleaved codeword is created is $$\left(\left\lceil\frac{w-1}{m}\right\rceil+1\right).$$

Thus, the buffering needed for the worst case is $$\left(\left\lceil\frac{w-1}{m}\right\rceil+1\right)L.$$

Some typical numbers might be m=3, L=16, w=32. Thus, the buffering needed would be $$\left(\left\lceil\frac{32-1}{3}\right\rceil+1\right)*16=192$$

bits for each encoder unit.

Adaptive Huffman Coding

There are two possible adaptive Huffman coding embodiments with this parallel method. In one example, there are several Huffman codes available depending on the current probability distribution of an alphabet of symbols. The data values can be any number of bits in size. There is a one to one mapping between codewords and data values. This type of system might use probability of the symbols as a stream splitter or parallelizing function. Other than these differences, the interleaving of this invention works exactly as described.

Another possibility is that the Huffman code switches which codeword represents which symbol based on the adaptive probability of the symbols. this code can be replicated and implemented in the same way as the JPEG Baseline Huffman coding.

JPEG Context Model Implemented With R-Coders

The non-baseline JPEG image compression standard provides a sequence of contexts to describe quantized transform coefficients. This context model is described in detail in *JPEG Still Image Data Compression Standard*. Although the standard specifies the QM-coder for the entropy coding, any lossless binary entropy coder could be used. Also, several binary entropy coders could be used to handle different contexts and these coders could be run in parallel with the present invention. In particular, several QM-coders or several R-coders could be used with the JPEG context model for fast decoding.

Mixed Coders

Note that with the basic interleaving model can accommodate any codes as long as the decoder is deterministic. So, for example, QM-Coders and R-Coders could be used in parallel. Lossy compressors, such as JPEG, could be used and could be mixed with lossless compressors. The data could even be of different types.

JPEG QM-Coder Context Model and Huffman Coder

In a data compression system of the present invention, one context may be used for one value. For example, a specific probability distribution can be coded with a Huffman code, such as shown in Table 20. In Table 20, the values from −3 to +3 are coded.

TABLE 20

| | Huffman Code For Small Integer | |
|---|---|---|
| Value | Estimated Prob. | Codeword |
| −3 | 0.0625 | 0000 |
| −2 | 0.0625 | 0010 |
| −1 | 0.25 | 01 |
| 0 | 0.25 | 11 |
| 1 | 0.25 | 10 |
| 2 | 0.0625 | 0011 |
| 3 | 0.0625 | 0001 |

If the code in Table 20 is used as of the bit generation element, then one context is used to decode the value.

In one embodiment of the present invention, multiple non-binary codes may be used for different types of values. In this case, the context model would obtain the next value from the appropriate non-binary context rather than obtaining several binary decision results as done in the prior art.

Figure 22:
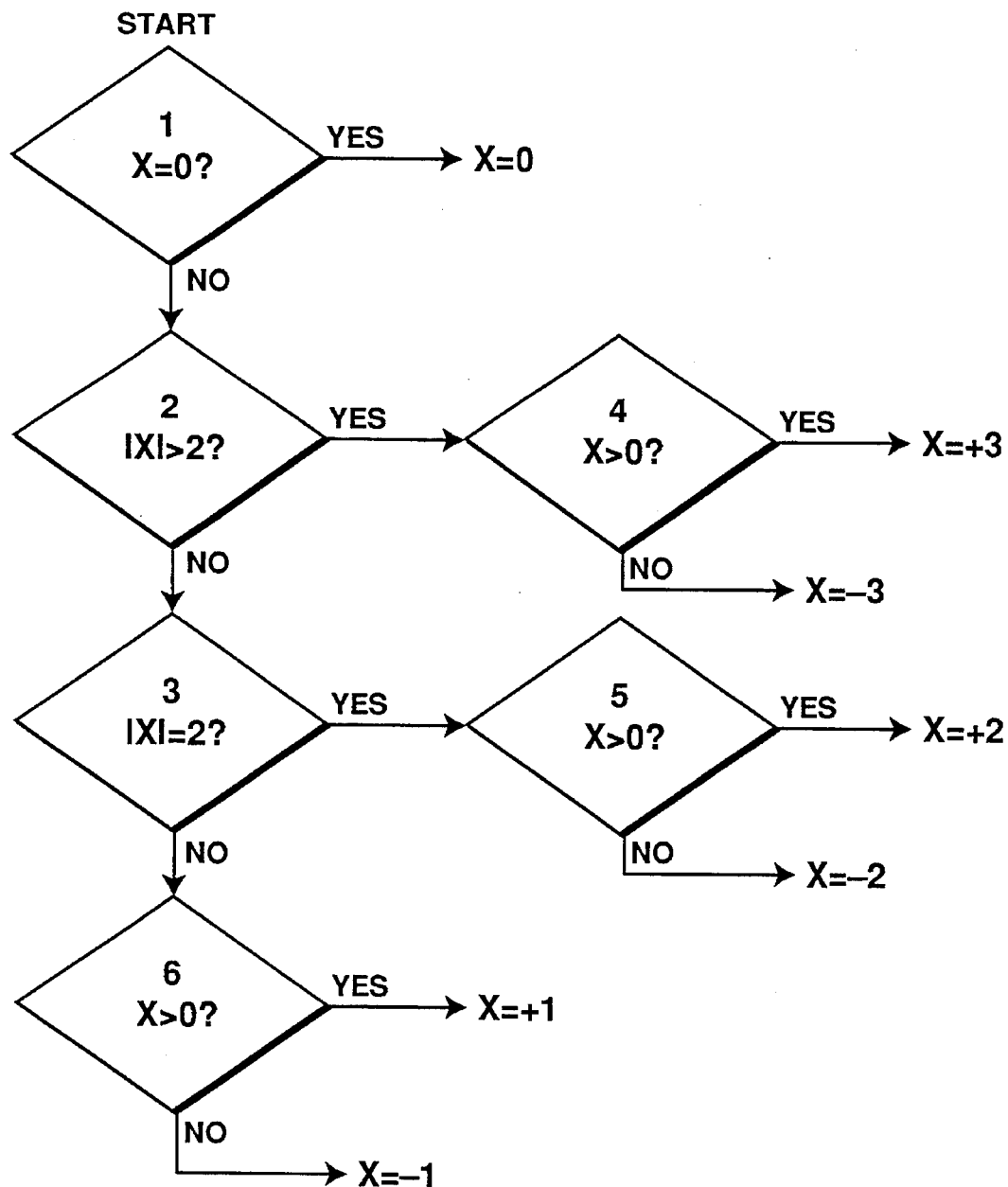
FIG. 22 is a decision tree for binarization.

For instance, if a small integer is to be binary decoded in the same −3 to +3 range, multiple contexts must be used. An exemplary decoding process is shown in FIG. 22, where contexts are labeled 1–6. The context model would first use context #1 to determine if the unknown value is equal to zero. After receiving the answer, either the unknown value is known or further questions with their own contexts must be asked. Thus, decoding a single value may require multiple contexts. For larger values, it may be necessary to decode nearly two contexts for every bit in the value being decoded. By using a single context, the present invention avoids using several contexts to decode one value. Furthermore, by using nonbinary codewords, decoding can be much faster and the context model can be much simpler.

It should be noted that the reordering circuitry operates the same as with binary decisions, except that it operates on codewords that represent whole values.

Systems like the non-baseline JPEG image compression standard get high compression by using binary decisions and adapting with each symbol compressed. However, breaking the magnitude of a transform coefficient down into several binary decisions can be very slow. As many as 16 binary decisions may be necessary to decode a single coefficient with magnitude of 128. In contrast, a Huffman code could specify the value of a coefficient with only one operation. The Huffman code would not be efficient for coding the decisions like whether or not a particular coefficient is zero. With the data interleaving system a hybrid approach could be used. A QM-coder could be used to determine several binary outcomes, but then a Huffman code could be used to specify the actual value of the coefficient. The outputs of these two codes could be interleaved in the usual manner, the Huffman code would provide a great increase in speed for some operations, while use of the QM-coder for other operations would maintain high compression efficiency.

Audio and Video Interleaving

Figure 23:
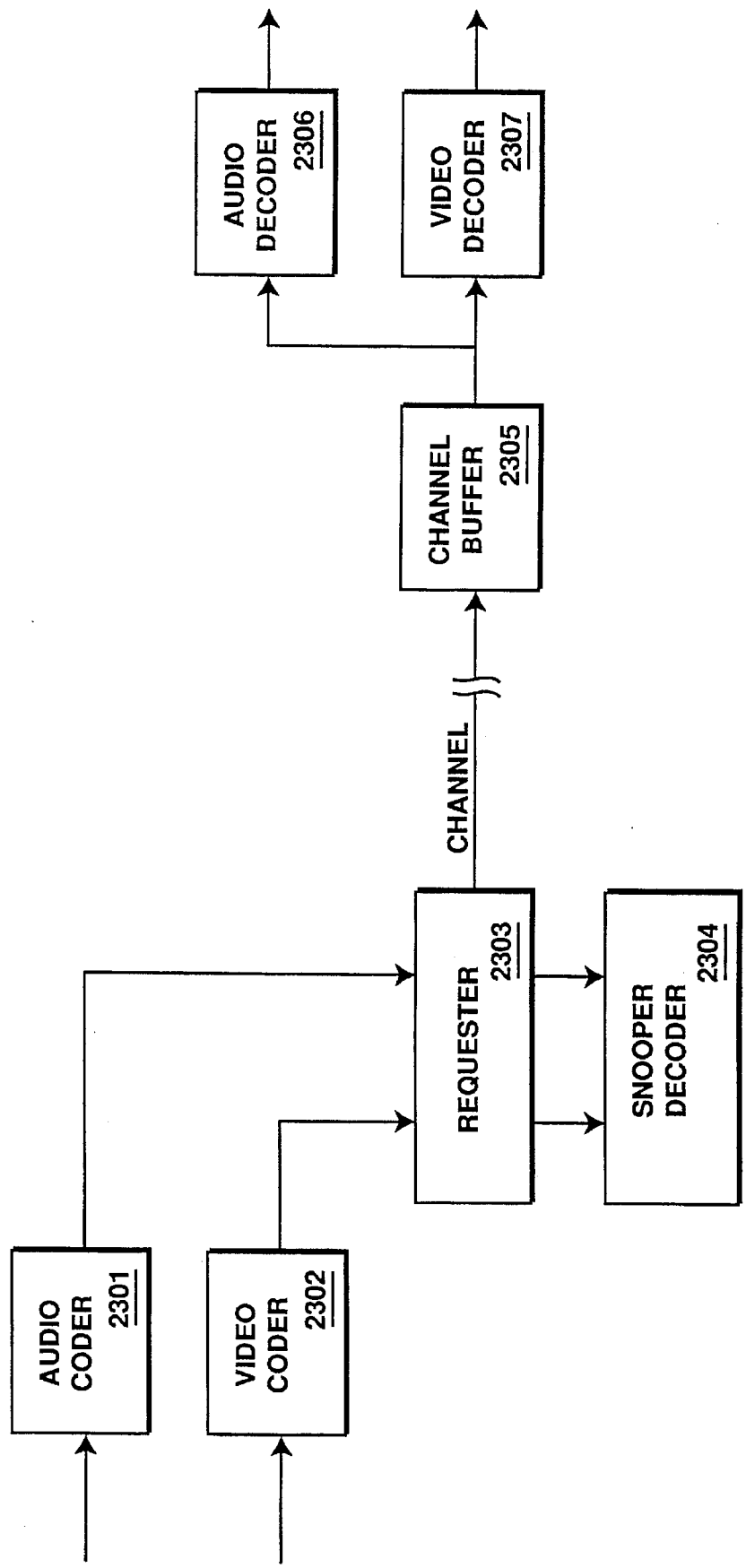
FIG. 23 is a block diagram of audio/video interleaved system of the present invention.

Audio and video interleaving is a problem in a low bit rate compressed digital audio-video systems. A low bit rate digital video interleave system is shown in FIG. 23. Referring to FIG. 23, an audio coder 2301 and a video coder 2302 supply encoded data from their respective audio and video sources. The encoded data is requested by requestor 2303 according to snooper decoder 2304. The encoded data is output onto the channel as a single interleaved stream. The data is received into channel buffer 2305 which directs the data to either the audio decoder 2306 and the video decoder 2307 based on their demand for data. In response, audio decoder 2306 and video decoder 2307 outputs the original data in reconstructed format. Audio and video data are transmitted on the same channel and must be synchronously decoded. Currently instream markers are used to distinguish between audio and video data. The markers in prior art methods reduce compression efficiency. With the interleaving of the present invention, this data could be interleaved based on demand of the audio and video decompressors without the need for markers. Interleaving allows optimal compression of the data.

System Applications

One virtue of any compression system is the reduce storage requirements for a set of data. The parallel system of the present invention may be substituted for any application currently fulfilled by a lossless coding system. These include facsimile compression, database compression, compression of bitmap graphic images, and compression of transform coefficients in image compression standards such as JPEG and MPEG. The present invention allows small efficient hardware implementation and relatively fast software implementations making it a good choice even for applications that do not require high speed.

Figure 24:
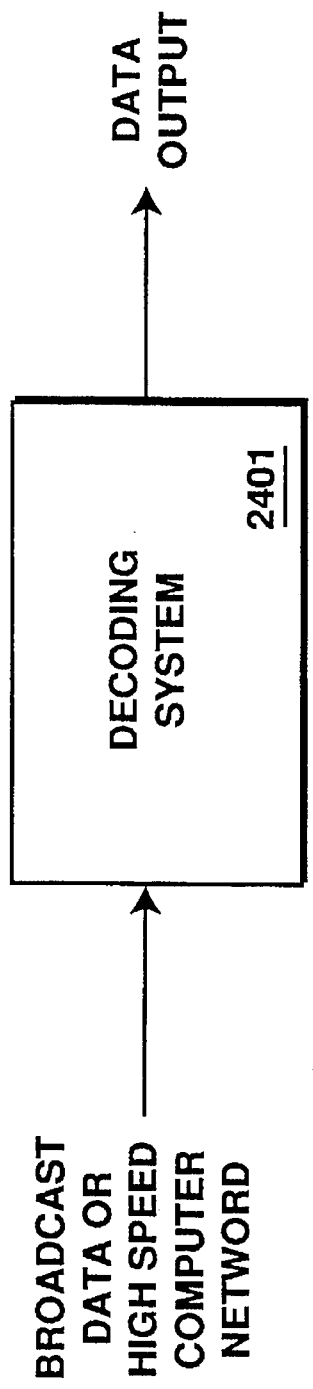
FIG. 24 is a block diagram of a high bandwidth system using the present invention.

The real virtue that the present invention has over the prior art is the possibility of operation at very high speeds, especially for decoding. In this manner, the present invention can make full use of expensive high speed channels, such as high speed computer networks, satellite and terrestrial broadcast channels. FIG. 24 illustrates such a system, wherein broadcast data or a high speed computer network supplies data to decoding system 2401 which decodes the data in parallel to produce output data. Current hardware entropy (such as the Q-Coder) would slow the throughput of these systems. All of these systems are designed, at great cost, to have high bandwidth. It is counter productive to have a decoder slow the throughput. The parallel system of the present invention not only accommodates these high bandwidths, it actually increases the effective bandwidth because the data can be transmitted in a compressed form.

Figure 25:
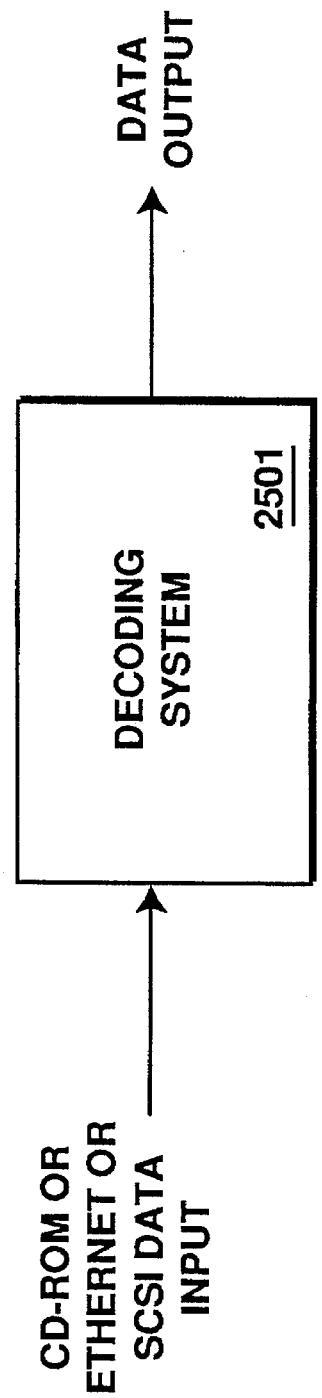
FIG. 25 is a block diagram of a bandwidth matching system using the present invention.

The parallel system of the present invention is also applicable to obtaining more effective bandwidth out of moderately fast channels like ISDN, CD-ROM, and SCSI. Such a bandwidth matching system is shown in FIG. 25, whereas data from sources, such as a CD-ROM, Ethernet, Small Computer Standard Interface (SCSI), or other similar source, is coupled to decoding system 2501, which receives and decodes to the data to produce an output. These channels are still faster than some current coders. Often these channels are used to service a data source that requires more bandwidth than the channel has, such as real-time video or computer based multimedia. The system of the present invention can perform the role of bandwidth matching.

Figure 26:
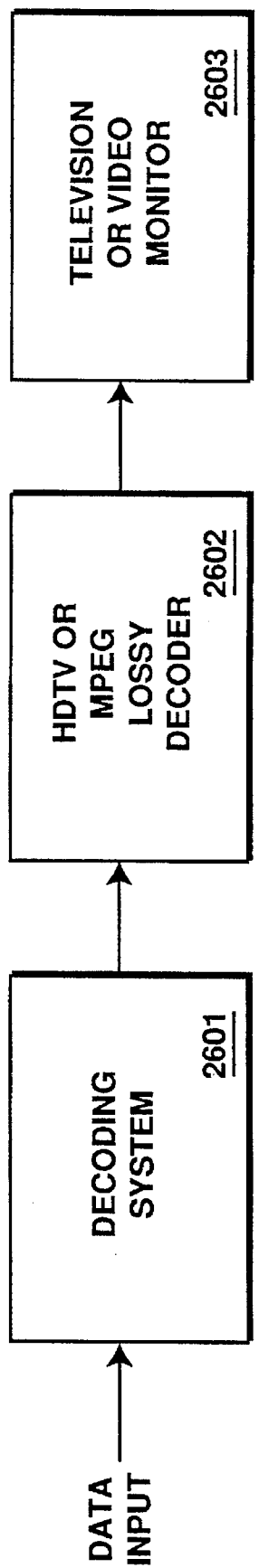
FIG. 26 is a block diagram of a real-time video system using the present invention.

The system of the present invention is an excellent choice for an entropy coder part of a real-time video system like the nascent High Definition Television (HDTV) and the MPEG video standards. Such a system is shown in FIG. 26. Referring to FIG. 26, the real-time video system includes decoding system 2601 which is coupled to compressed image data. System 2601 decodes the data and outputs it to lossy decoder 2602. Lossy decoder 2602 could be the transform, color conversion and subsampling portion of an HDTV or MPEG decoder. Monitor 2603 may be a television or video monitor.

Whereas many alterations and modifications of the present invention will no doubt become apparent to a person of ordinary skill in the art after having read the foregoing description, it is to be understood that the particular embodiment shown and described by way of illustration is in no way intended to be considered limiting. Therefore, references to details of the preferred embodiment are not intended to limit the scope of the claims which in themselves recite only those features regarded as essential to the invention.

Thus, a method and apparatus for parallel decoding and encoding of data has been described.

We claim:

1. A method for decoding a data stream of a plurality of codewords comprising the steps of:

assigning portions of the data stream to a plurality of decoding resources;

entropy decoding the portions of the data stream in parallel using the plurality of decoding resources and a decoding scheme employing contexts and probabilities, wherein the step of entropy decoding comprises the steps of at least one of the plurality of decoding resources determining a context in one stage of a decoding pipeline, said at least one of the plurality of decoding resources reading a decoder state from memory in a first next stage of the decoding pipeline immediately following said one stage of the decoding pipeline, and said at least one of the plurality of decoding resources generating at least one decoded bit in a second next stage of the decoding pipeline immediately following said first next stage, such that said at least one of the plurality of decoding resources decodes its corresponding portion of the data stream during successive cycles in a pipelined manner.

2. The method defined in claim 1 wherein said decoder state comprises a probability state and a bit generation state.

3. The method defined in claim 1 further comprising the step of ordering the data stream into an ordered data stream.

4. The method defined in claim 3 wherein said step of assigning includes assigning the portions according to the order of the data stream.

5. The method defined in claim 1 wherein the plurality of decoding resources includes a plurality of QM-coders.

6. The method defined in claim 1 wherein the plurality of decoding resources includes a plurality of lossy decoders.

7. A method for decoding a data stream of a plurality of codewords comprising the steps of:

assigning portions of the data stream to a plurality of decoding resources;

entropy decoding the portions of the data stream in parallel using the plurality of decoding resources and a decoding scheme employing contexts and probabilities, wherein at least one of the plurality of decoding resources decodes its corresponding portion of the data stream during successive cycles in a pipelined manner and includes a first type of decoder and a second type of decoder, wherein the first type of decoder is different that the second type of decoder.

8. The method defined in claim 7 wherein the first type of decoder comprises a run-length coder and the second type of decoder comprises a Q-coder.

9. The method defined in claim 7 wherein the first type of decoder comprises a binary coder and the second type of coder comprises a non-binary decoder.

10. The method defined in claim 7 wherein the first type of decoder comprises a lossless decoder and the second type of decoder comprises a lossy decoder.

11. A method for decoding a data stream of a plurality of codewords comprising the steps of:

determining a current context bin in one pipestage in a decoding pipeline;

fetching a decoder state for the context bin from memory in a first next pipestage immediately after the one pipestage in the decoding pipeline; and processing one of the codewords beginning in a second next pipestage immediately after the first next pipestage in the decoding pipeline, including the step of decoding said one of the codewords, wherein the steps of determining, fetching and processing occur in successive cycles in a pipelined manner.

12. The method defined in claim 11 further comprising the step of shifting the data stream to a codeword following said one of the codewords.

13. The method defined in claim 11 wherein the step of fetching the decoder state includes the steps of:

fetching a PEM state; and fetching a bit generation state.

14. The method defined in claim 11 wherein the step of processing includes the steps of:

generating a decoded bit; and decoding said one of the codewords, such that the decoded bit is generated prior to the decoding of said one of the codewords.

15. The method defined in claim 14 wherein the steps of generating and decoding occur in successive cycles.

16. The method defined in claim 11 further comprising the step of decoding a PEM state to determine a code for decoding said one of the plurality of codewords.

17. The method defined in claim 11 further comprising the step of updating a PEM state to produce an updated PEM state after said one of the plurality of codewords has been decoded.

18. The method defined in claim 17 wherein the step of updating and the step of decoding occur in the same cycle.

19. The method defined in claim 17 further comprising the step of writing the updated PEM state to memory.

20. A method for decoding a data stream of a plurality of codewords comprising the steps of:

determining a current context bin for one of said plurality of codewords in a first stage of a decoding pipeline;

fetching a probability estimate machine (PEM) state for the current context bin in a second stage of a decoding pipeline immediately following the first stage;

fetching a bit generator state for the current context bin in a second stage of a decoding pipeline immediately following the first stage;

generating a decoded bit representing a first bit of said one of the plurality of codewords being decoded in a third stage of a decoding pipeline immediately following the second stage;

decoding the PEM state to determine a code for decoding said one of the plurality of codewords; and decoding said one of the codewords using the code.

21. The method defined in claim 20 wherein the steps of generating a decoded bit and decoding said one of the plurality of codewords occur in two consecutive cycles in a pipelined manner.

22. The method defined in claim 20 wherein the steps of generating a bit and decoding the PEM state occur in successive cycles in a pipelined manner.

23. The method defined in claim 20 further comprising the step of reusing said current context bin for the codeword immediately following said one of the plurality of codewords, wherein requirements to access external memory to obtain the context information is obviated.

24. A system for decompressing a data stream having a plurality of codewords, said system comprising:

channel means for receiving the plurality of codewords of the data stream;

decoder means coupled to said channel means, for entropy decoding codewords in parallel based on contexts and probabilities, wherein the plurality of codewords are decoded in a decoding pipeline in a pipelined manner, wherein the decoding pipeline comprises a first stage to determine a context, a second stage immediately following the first stage to read a decoder state from memory, and a third stage immediately following the second stage to generate at least one decoded bit, such that decoding pipeline decodes its corresponding portion of the data stream during successive cycles in a pipelined manner.

25. The system defined in claim 24 wherein at least two of the codewords in the data stream are decoded at the same time, such that the data stream is decoded in parallel.

26. The system defined in claim 24 wherein said decoder means includes a plurality of decoders.

27. A system for decompressing a data stream of a plurality of codewords comprising:

channel control means for receiving the plurality of codewords of the data stream and partitioning the plurality of codewords into a plurality of data streams based on contexts and probabilities;

a plurality of bit stream generators, each coupled to receive a distinct one of the plurality of data streams from the channel control means, wherein each of the plurality of bit stream generators decodes each of the codewords using at least one non-binary code, and further wherein at least two of the plurality of bit stream generators decodes codewords at the same time, such that the data stream is decoded in parallel to produce decoded data; and modeling means coupled to the plurality of bit stream generators for selecting the decoded data from the plurality of bit stream generators to output the decoded data.

28. The system defined in claim 27 wherein the said at least one non-binary code comprises a Tunstall code.

29. The system defined in claim 27 wherein the plurality of bit stream generators uses a plurality of non-binary codes.

30. A system for decompressing a data stream having a plurality of codewords, said system comprising:

channel means for receiving the plurality of codewords;

a plurality of bit generators coupled to the channel means, wherein the plurality of generators comprises a plurality of Huffman decoders and receives the plurality of codewords from the channel means as a continuous stream and entropy decodes the plurality of codewords into a decoded data stream in parallel using contexts and probabilities, wherein at least two of the plurality of bit generators decode codewords in parallel; and control means coupled to the plurality of bit generators for controlling the plurality of bit generators to receive individual and successive codewords from the channel means for decoding in parallel.

31. The system defined in claim 30 wherein each of the plurality of bit generators decodes every $n^{th}$ codeword in the data stream, where n comprises the number of the plurality of bit stream generators.

32. The system defined in claim 30 wherein the control means includes a state machine.

33. The system defined in claim 30 wherein the channel means includes a buffer, wherein the control means provides data to each of the plurality of Huffman decoders in order, such that each Huffman decoder receives every nth token where n is the number of Huffman decoders.

34. The system defined in claim 33 wherein the codewords are delivered to the plurality of Huffman decoders and the tokens are decoded in the same sequential order used during encoding.

35. The system defined in claim 33 wherein the plurality of Huffman decoders perform decoding according to the JPEG standard, except for the interleaved order of the codewords.

36. The system defined in claim 33 wherein the plurality of Huffman decoders perform decoding according to the MPEG standard, except for the interleaved order of the codewords.

37. The system defined in claim 33 wherein at least one of the plurality of Huffman decoders decodes data using one of plurality of available Huffman codes, wherein each of the plurality of available Huffman codes is selected based on the probability of the current values.

38. The system defined in claim 33 wherein the control means includes a state machine.

39. The system defined in claim 33 further comprising a QM-coder for determining binary decision outcomes, wherein the plurality of Huffman decoders specify coefficient values in response to the outcomes.

40. The system defined in claim 30 wherein at least one of the plurality of Huffman decoders switches the corresponding codeword for a particular symbol based on the adaptive probability of the symbol.

41. The system defined in claim 30 wherein the control means includes a context model.

42. The system defined in claim 30 further comprising at least one JPEG QM-coder.

43. A method for forming a composite code stream from a plurality of code streams, wherein each of the plurality of code streams includes a plurality of codewords, said method comprising the steps of:

packing codewords in each of the plurality of code streams into fixed-length segments;

interleaving the codewords from the plurality of code streams according to an assigned sequence of the codewords in the fixed-length segments, such that the composite code stream includes the plurality of codewords in the plurality of code streams.

44. The method defined in claim 43 wherein the step of interleaving includes interleaving by adding a fixed-length segment to the composite code stream having the codeword nearest to the beginning of the composite code stream.

45. The method defined in claim 43 further comprising the step of assigning an order to codewords in the plurality of code streams according to the modeling order.

46. The method defined in claim 43 wherein one of the plurality of code streams includes audio data and another of the plurality of code streams includes video data, such that the composite code stream includes audio data and video data interleaved.

47. A system for decoding a code stream having a plurality of codewords, said system comprising:

a buffer to supply codewords from the code stream;

a context model to provide contexts;

a memory located on an integrated circuit and coupled to the context model to store state information, wherein the memory provides state information in response to each context provided by the context model;

a plurality of decoders located on the integrated circuit and coupled to the buffer and the memory to decode codewords supplied by the buffer using state information from the memory, wherein two of the plurality of decoders decode codewords in parallel, such that the plurality of decoders decodes the code stream, wherein the buffer, context model, memory and plurality of decoders operate to determine contexts, estimate probabilities, decode codewords and generate bits from run counts in a pipelined manner.

48. The system defined in claim 47 wherein the memory stores information for commonly used contexts.

49. The system defined in claim 47 wherein the memory stores the least significant portion of larger run counts and accesses external memory at the end of the run.

50. The system defined in claim 47 wherein the memory stores state information for a portion of bit generators and uses external memory for the remaining state information.

51. The system defined in claim 47 wherein said memory includes at least two banks of memory, wherein each of said two banks of memory stores state information for separate sets of context bins, and further wherein said at least two banks of memory are accessed in alternate cycles.

52. A method for performing JPEG decompression on an image data stream of a plurality of codewords comprising the steps of:

assigning portions of the data stream to a plurality of decoding resources;

entropy decoding the portions of the data stream using the plurality of decoding resources operating in parallel on separate codewords, wherein at least two of the plurality of decoding resources comprise R-coders and portions of the data stream are decoded using a lossless binary entropy coder.

53. A method for encoding a data stream comprising the steps of:

encoding with a finite amount of buffer memory; and signaling between an encoder and a decoder to indicate that a memory limit has been reached.

54. The method defined in claim 53 wherein the encoder generates an output in response to said signalling indicating that the memory limit has been reached.

55. The method defined in claim 53 wherein the step of signaling includes adding non-maximum length runs of most probable symbols that are not followed by a least probable symbol.

56. The method defined in claim 53 wherein the step of signaling comprises the steps of:

timestamping the codewords in the data stream;

buffering the codewords after timestamping; and completing the codeword with the lowest time stamp until the memory limit is no longer reached.

57. The method defined in claim 53 wherein the step of signaling includes the step of providing status of the memory to the decoder using a separate context bin, and wherein the context bin is decoded for every codeword to indicate whether or not the codeword was due to a buffer overflow.

58. An encoder comprising:

a sequencer for receiving a data stream of a plurality of codewords;

a plurality of coders coupled to the sequencer for entropy encoding the plurality of codewords using contexts and probabilities;

buffer means coupled to the plurality of coders or buffering the encoded codewords;

interleaving mechanism for requesting the encoded data from the buffer means to produce an output stream of interleaved encoded data;

decoder coupled to the interleaving mechanism for modeling the order for encoding the data, wherein the decoder operates in a pipelined manner using contexts and probabilities.

59. The encoder defined in claim 58 further comprising means for indicating when the buffer means overflows.

60. The encoder defined in claim 59 wherein the means for indicating includes at least one predetermined codeword.

61. An encoder comprising:

a sequencer for receiving a data stream of a plurality of codewords;

a plurality of coders coupled to the sequencer for encoding the plurality of codewords;

buffer means coupled to the plurality of coders for buffering the encoded codewords;

interleaving mechanism for requesting the encoded data from the buffer means to produce an output stream of interleaved encoded data, wherein interleaving mechanism includes means for outputting data that is not fully encoded when the memory limit for the buffer means has been reached.

62. The encoder defined in claim 61 further comprising means for adding non-maximum length runs of most probable symbols that are not followed by a least probable symbol.

63. The encoder defined in claim 61 further comprising:

means for timestamping the codewords in the data stream;

means coupled to the timestamping means for buffering the codewords after timestamping; and means for completing the codeword with the lowest time stamp until the memory limit is no longer reached.

64. A real-time video system for decompressing a data stream of a plurality of codewords comprising:

first plurality of entropy decoding resources coupled to receive the data stream for decoding each codeword in the data stream, wherein at least two of the first plurality of decoding resources operate to decode separate codewords at the same time such that the data stream is decoded in parallel;

formatting means for formatting the decoded data stream to prepare the decoded data stream for display; and display means for displaying the decoded data.

65. The system as defined in claim 64 wherein the display means comprises a television monitor.

66. The system as defined in claim 64 wherein the display means comprises a video monitor.

67. The system as defined in claim 64 wherein one of the first plurality of decoding resources comprises second decoder means for lossy decoding codewords in the data stream.

68. The system as defined in claim 67 wherein the lossy decoder comprises the transform portion of a decoder.

69. The system as defined in claim 67 wherein the lossy decoder comprises the color conversion portion of a decoder.

70. The system as defined in claim 67 wherein the lossy decoder comprises the subsampling portion of a decoder.

* * * * *